(12) United States Patent
Okamoto

(10) Patent No.: US 6,304,617 B1
(45) Date of Patent: Oct. 16, 2001

(54) VITERBI DECODER

(75) Inventor: Yasufumi Okamoto, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/089,696

(22) Filed: Jun. 3, 1998

(30) Foreign Application Priority Data

Jun. 4, 1997 (JP) .................................... 9-163414
Mar. 25, 1998 (JP) .................................... 10-98468

(51) Int. Cl.[7] .............................. H03D 1/00; H04L 27/06
(52) U.S. Cl. ........................ 375/341; 375/262; 714/795
(58) Field of Search .................................. 375/341, 262, 375/265; 714/795, 796, 794, 792, 793

(56) References Cited

U.S. PATENT DOCUMENTS

| | | | |
|---|---|---|---|
| 5,970,104 | * 10/1999 | Zhong et al. .................. | 375/341 |
| 5,982,822 | * 11/1999 | Hatakeyama .................. | 375/341 |
| 5,991,343 | * 11/1999 | Oh et al. ...................... | 375/341 |
| 5,995,562 | * 11/1999 | Koizumi ....................... | 375/341 |

OTHER PUBLICATIONS

Nikkei Electronics, No. 537, An application of a viterbi decoding and LSI to magnetic recording being examine. There is a great demand for them. Sep. 30, 1991, pp. 315–319.

* cited by examiner

Primary Examiner—Chi Pham
Assistant Examiner—Phuong Phu

(57) ABSTRACT

A viterbi decoder includes a branch metric calculation unit, a path selection unit, and a path memory unit. The branch metric calculation unit calculates a likelihood of a branch obtained through a received convolutional code. The path selection unit adds metrics of branches extending from a time point $t=n$ to a time point $t=n+1$ obtained at the branch metric calculation unit to path metrics of a number of states that a convolutional code may assume at the time point $t=n$ and compares path metrics for each state at the time point $t=n+1$ to select an optimal path for each state at the time point $t=n+1$. The path memory unit stores in memory path data corresponding to the optimal path for each state at individual points in time. The path memory includes a memory unit that stores path data corresponding to optimal paths at individual points in time and a selection circuit group that is capable of selecting one state at the time point $t=m-1$ that corresponds to a specific state at the time point $t=m$ in conformance to the path data stored in the memory unit.

31 Claims, 15 Drawing Sheets

1

<u>1</u>

| | | |
|---|---|---|
| Address 1 | State S2 metric | State S3 metric |
| Address 0 | State S0 metric | State S1 metric |

403, 405, 407

VITERBI DECODER

BACKGROUND OF THE INVENTION

The present invention relates to a viterbi decoder employed for maximum likelihood decoding of convolutional codes.

Multipath phasing occurring in radio communication such as mobile communications and satellite communications caused by obstructions such as buildings results in a different code sequence received at the reception side from the code sequence transmitted by the transmission side. If such an error in code transmission occurs in, for instance, voice encoding, the quality of reproduced sound at the reception side will be greatly degraded, necessitating appropriate error correction.

Convolutional codes, which can be decoded to achieve a result that is the maximum likelihood or close to the maximum likelihood through viterbi decoding, are effective codes for use in a communication path such as a radio line, in which the error rate in transmitted code is high. FIG. 17 presents an example of an encoder that performs convolutional encoding at an encoding rate R=½ with a constraint length of K=3.

In this convolutional encoder 101, three bits including the most recent one bit input are stored at a buffer 103 and through convolutional encoding, an output of two bits is achieved. One of the two bits thus output represents the results of calculation performed by an exclusive OR gate (not shown) on all the bits in the buffer 103, whereas the other one bit indicates the results of calculation performed by another exclusive OR gate (not shown) on the first and third bits in the buffer 103.

FIG. 18 presents a trellis chart achieved by rendering the generating conventions of convolutional encoding performed by the convolutional encoder 101 into a state transition diagram. In this trellis chart 111, time points "t" corresponding to instances of convolutional encoding are indicated in the horizontal direction and the states of the encode word are indicated in the vertical direction. In addition, the number of states, which is determined by the constraint length K=m+1, is expressed as $2^m$. Consequently, the number of states in this diagram is 4, which corresponds to states S0–S3, as shown in FIG. 18.

In viterbi decoding, maximum likelihood decoding is performed by determining the metric for each of the states S0–S3 at the individual time points "t" in the trellis chart 111, and this decoding may be realized by employing a viterbi decoder 121 illustrated in FIG. 19.

The following is an explanation of the operation of the viterbi decoder 121. First, a reception sequence Y is input to a branch metric calculating unit (hereafter referred to as a "BMG") 123. As shown in the trellis chart 111, there are two paths (hereafter referred to as "branches") through which input is performed for each of the states S0–S3, and the BMG 123 calculates metrics for all the branches. A path selection unit (hereafter referred to as an "ACS") 125 compares the sums of the accumulated totals (path metrics) of the branch metrics at the states S0–S3 at the time point t−1 immediately before the branches become linked and their branch metrics for two input branches for each of the states S0–S3 at a time point "t" and selects the one that is more likely, to assign it as a new path metric at each of the states S0–S3. Thus, for each branch that is to link with each of the states S0–S3, information on the path reaching each of the states S0–S3 is stored in a path memory unit (hereafter referred to as a"PMEM") 127 and a decode sequence W is output with specific timing.

Now, in order to achieve maximum likelihood decoding in the strict sense by employing the viterbi decoder 121, it is necessary that the viterbi decoding continue until the reception sequence Y is completed. However, since the reception sequence Y is normally quite long, a tremendous memory capacity is required in the PMEM 127 and an excessive length of time is required for the decoding.

It has been learned through experience that under normal circumstances, as long as an encode sequence length that is 5–6 times the constraint length K is assured, decoding that is extremely close to maximum likelihood decoding in the strictest sense is possible with a viterbi decoder. Based upon this finding, the truncation encode sequence length of the convolutional encoder 101 with a constraint length K=3, i.e., the number of truncations T, is set at T=18 in correspondence to the time points t=0–17, as illustrated in FIG. 18. The memory capacity of the PMEM 127 in the viterbi decoder 121 is determined in correspondence to the truncations T=18.

As illustrated in FIG. 20, the PMEM 127 in the prior art is constituted of unit path memories 131, the number of which that are be connected corresponds to the product of the number of states S0–S3 and the number of stages of the truncations T. In addition, the unit path memories 131 are each constituted of a selector 133 and a shift register 135, and store in memory the results of the selections of the maximum likelihood paths at states S0–S3 at the time points t=0–17.

Furthermore, the soft decision making system, in which the reception sequence Y is handled as input data having a bit-width of several bits, is often adopted in viterbi decoders in order to enhance their error correction capabilities. By adopting this method, since the input data are repeatedly added in correspondence to the encoding rate R during the branch metric calculation performed by the BMG 123, the bit-width of the data obtained as a result of the calculation increases in correspondence to the bit-width of the input data. Since the ACS125 repeats state metric calculation and state transition a plurality of times, based upon the data obtained through the branch metric calculation performed at the BMG 123, the calculation bit-width at the ACS 125 will exhibit some spreading.

Since the total ratio of the areas occupied by the BMG and the ACS in the entire viterbi decoder sometimes reaches 40% under specific conditions, reducing the ACS circuit scale will directly lead to a reduction in the scale of the viterbi decoder. Thus, in the prior art, the ACS is made to perform processing such as simultaneous subtraction of state metric values in order to avoid an overflow or an underflow in the calculation, to ensure that the circuit scale does not become excessively large.

Normally, an ACS is provided with ACS circuits that perform state metric calculation for the individual states, and the ACS 125 is provided with four ACS circuits 201, one of which is illustrated in FIG. 21. While the number of the adders, comparators, selectors and the like constituting each ACS circuit 201 increases in correspondence to the calculation bit-width explained above, the increase in the calculation bit-width does not result in a large increase in the circuit scale of the ACS 125 as long as the number of ACS circuits 201 is kept down to four or so. However, if the constraint length is increased from K=3 to K=9 in order to improve the error code capability, the number of ACS circuits 201 increases in an exponential function from 4 to 256, resulting in an increase in the scale of the ACS 125 and, ultimately, an increase in the scale of the entire viterbi decoder 121. In the prior art, this problem is handled by providing circuits 125 in a quantity representing 1/N of the number of states and by repeating the calculation of state metrics at the ACS circuits 125 N times, i. e., by performing the calculations using time sharing.

SUMMARY OF THE INVENTION

However, the following objects are yet to be fulfilled by the viterbi decoder 121 in the prior art, with respect to the increase in the circuit scale and with respect to the decoding processing speed.

First Object

When setting the constraint length K at a large value in order to improve the error correction capability, it is necessary to increase the number of the unit path memories 131 in correspondence to the increase in the constraint length K in the PMEM 127 of the viterbi decoder 121 in the prior art.

For instance, when the truncations T in the convolutional encoder 101 with a constraint length K=3 is set 6 times the constraint length K, the number of unit path memories 131 required in the PMEM 127 of the viterbi decoder 121 is $2^{K-1} \times (K \times 6) = 2^2 \times (3 \times 6) = 72$.

However, if the constraint length K is doubled to 6 in order to achieve an improvement in the error correction capability, the number of required unit path memories 131 is $2^5 \times (6 \times 6) = 1152$. Thus, when the constraint length K is set at a large value, the number of required unit path memories 131 increases exponentially, resulting in a great increase in the circuit scale.

In addition, if the number of unit path memories 131 increases, the scale of the circuit pattern and the gates for connecting them also increases, and it is extremely difficult to avoid an increase in the chip area when constituting the viterbi decoder 121 on one chip by adopting a method such as LSI implementation.

Furthermore, when storing the maximum likelihood path selected at the ACS 125 in the PMEM 127, it is necessary to operate all the shift registers 135 at the PMEM 127 every time a transition in time point occurs t=0–t=17 and, consequently, the number of unit path memories 131 increases exponentially as described above, which also results in an increase in the power consumption in the entire viterbi decoder 121.

Second Object

The operation of the ACS 125 provided with a reduced number of ACS circuits 201 at 1/N, e.g., 4/4=1, in order to achieve a reduction in circuit scale of the ACS 125, is explained in reference to FIGS. 18 and 21.

For instance, the calculation of the state S0 at the time point t=1 is executed as follows.

(1) The state metric held for the state S0 at the time point t=0 and the branch metric of a branch reaching the state S0 at the time point t=1 from the state S0 at the time point t=0 are added together.

(2) The state metric held for the state S1 at the time point t=0 and the branch metric of a branch reaching the state S0 at the time point t=1 from the state S1 at the time point t=0 are added together.

(3) The added value obtained in (1) and the added value obtained in (2) are compared against each other, and the value with the higher likelihood is selected, to set the results of the selection as the state metric for the state S0 at the time point t=1.

The state metric for the state S0 at the time point t=1 obtained through the calculation described above, is then stored in a state metric storage memory 211. However, since the state metrics for the state S0 and the state S1 at the time point t=0 are used again in the calculation of the state metric for the state S2 at the time point t=1, which is executed subsequently, the state metric for the state S0 at the time point t=1 is not directly written in the state metric storage memory 211 but is temporarily stored in a temporary storage memory 213. Likewise, the results of the calculation of the states S1–S3, at the time point t=1 are all temporarily stored in the temporary storage memory 213. Then, after the calculation of all the states S0–S3 at the time point t=1 is completed, the state metrics for all the states S0–S3 at the time point t=1 stored in the temporary storage memory 213 are transferred into the state metric storage memory 211 before the calculation of the states S0–S3 at the time point t=2 is performed.

While the circuit scale of the ACS 125 is reduced with the number of ACS circuits 201 provided in the ACS 125 at 1/N of the number of states S0–S3, the length of time required for the calculation is N times longer. In addition, the length of time required for the data transfer from the temporary storage memory 213 to the state metric storage 211 reduces the throughput of the viterbi encoder 121. Furthermore, while a means for achieving higher speed at the internal processing clock may be adopted to maintain the level of throughput, a great deal of modification in design, including modification of the peripheral circuits, will be required to support such a high clock speed, causing a concern that this will result in an increase in the cost.

Third Object

Under normal circumstances, a viterbi decoder performs data decoding and error correction by using the path that has reached the state with the highest likelihood at a time point at which the trace-back processing is commenced, e.g., the time point t=17 as a surviving path and by tracing back the path that has reached the state through time points t=16, 15, . . . 1, 0. Thus, when performing the trace-back processing, it is necessary to select the state with the maximum likelihood from all the states at the point in time at which the trace-back is commenced.

For instance, with the constraint length at K=3 and the number of states at 4, it is highly unlikely that a problem with respect to the scale of the maximum likelihood state selection circuit for selecting one of the four states and the length of time required for the selecting process would arise. However, with the constraint length K set at 9 in order to improve the error correction capability and the number of states at 256 as a result, the length of time required for selecting the maximum likelihood state increases considerably. To explain in more specific terms, when a maximum likelihood state selection circuit that selects one state out of four states is employed, for instance, the maximum likelihood state is determined through one selection operation if the constraint length K is set at 3 with the number of states at 4. In addition, when the constraint length K is set at 5, the number of states is 16, and the maximum likelihood state is determined through 5 selection operations. When the constraint length K is set at 9, the number of states is 256, necessitating 85 selection operations to determine the maximum likelihood state. Thus, in order to reduce the length of time required for the selection of the maximum likelihood state out of the states, the number of which increases exponentially in correspondence to an increase in the constraint length, it is necessary to increase the scale of the maximum likelihood state selection circuit in correspondence to the number of states.

A first object of the present invention, which has been completed by addressing the problems of the viterbi decoder 121 in the prior art discussed above, is to provide a viterbi decoder that is capable of performing maximum likelihood decoding while minimizing the extent to which the circuit scale is increased and the extent to which the power consumption increases, even when the constraint length K is set at a large value in order to improve the error correction capability.

A second object of the present invention is to provide a viterbi decoder that is capable of maintaining the level of decoding throughput while minimizing the extent of any reduction in processing speed of metric calculation performed at the ACS, even when the number of ACS circuits provided at the ACS is reduced to 1/N of the number of states in order to reduce the circuit scale.

A third object of the present invention is to provide a viterbi decoder provided with a maximum likelihood state selection circuit that is capable of selecting the maximum likelihood state in a reduced length of time even when the constraint length is set at a large value.

In order to achieve the objects described above, in a first aspect of the present invention, a viterbi decoder having a branch metric calculation unit that calculates the likelihood of a branch obtained through received convolutional code, a path selection unit that adds metrics of the branches extending from the time point t=n to the time point t=n+1 (the time point t=n+1 indicates a point in time one clock cycle after the time point t=n) obtained at the branch metric calculation unit to the path metrics of a plurality of states that the convolutional code may assume at the time point t=n (the time point t=n indicates an arbitrary point in time) and compares the path metrics for each state at the time point t=n+1 to select an optimal path for each state at the time point t=n+1, and a path memory unit that stores in memory the path data corresponding to the optimal path for each state at individual points in time is provided. In addition, the path memory unit provided in the viterbi decoder is provided with a memory unit that stores path data corresponding to optimal paths at each point in time and a selection circuit group that is capable of selecting one state at the time point t=m−1 (the time point t=m−1 indicates a point in time one clock cycle before a point in time t=m) that corresponds to a specific state at the time point t=m (the time point t=m indicates an arbitrary point in time) in conformance with the path data stored in the memory unit.

Through this structure, trace-back processing, in which a maximum likelihood path is determined in reference to a specific state at a specific point in time by sequentially reading out the path data stored in the memory unit in the reverse direction with respect to the original time sequence is realized. Consequently, it is possible to support an increase in the number of stages of truncation for purposes of improving the error correction capability, as long as a sufficient memory capacity for storing path data, the volume of which corresponds to the number of stages of truncation, is assured in the memory unit without having to modify the structure of the selection circuit group. In other words, effective maximum likelihood decoding becomes possible while minimizing the increase in the circuit scale.

In addition, the memory unit is provided with data input/output ports, the number of which corresponds to the number of states. Furthermore, the memory unit is structured so as to have an address length that corresponds to the number of truncation stages of the convolutional code. This structure makes it possible to support an increase in the number of truncation stages while keeping down the extent of any increase in the circuit scale to an absolute minimum necessary.

The selection circuit group is constituted of a plurality of selection circuits that correspond to the individual states. One of the plurality of selection circuits is selected in conformance to the path data stored in the memory unit. In this structure, the state that corresponds to the selected selection circuit is determined to be the state that forms the maximum likelihood path.

Input portions and output portion of each selection circuit are connected through a circuit configuration that corresponds to branches formed between a plurality of states at the time point t=1 (the time point t=1 indicates an arbitrary point in time) and a plurality of states at the time point t=1+1 (the time point t=1+1 indicates a point in time one clock cycle after the time point t=1). Furthermore, by connecting the output portions of two specific selection circuits selected from the plurality of selection circuits to the input portion of a specific corresponding selection circuit via an OR gate, efficient trace-back processing is achieved.

One of the plurality of selection circuits provided in the selection circuit group is selected by an external signal at a specific time point. By inputting a signal that indicates the maximum likelihood state from the path selection unit to the selection circuit group as an external signal after specific calculation processing is completed at the time point that corresponds to the last stage among the truncation stages, the trace-back processing will be implemented by using as a reference the selection circuit that corresponds to this maximum likelihood state, and ultimately the maximum likelihood path will be obtained.

In addition, the path memory unit provided in the viterbi decoder may be provided with N (N represents an arbitrary natural number) memory units that store the path data corresponding to an optimal path at each point in time and N selection circuit groups that are capable of selecting one state at the time point t=m−1 (the time point t=m−1 indicates a time point one clock cycle before the time point t=m) based upon a specific state at the time point t=m (the time point t=m indicates an arbitrary point in time) in conformance to the path data stored in the individual memory units. In this structure, during the trace-back processing, specific states at a plurality of time points are selected at once. Consequently, the length of time required for the trace-back processing is further reduced.

The N memory units are each provided with data input/output ports, the number of which corresponds to the number of states. In addition, each of the N memory units is structured so as to have an address length that corresponds to 1/N of the number of truncation stages of a convolutional code. This structure makes it possible to support an increase in the number of truncation stages while keeping down the increase in the circuit scale to the absolute minimum necessary.

Each of the N selection circuit groups is constituted of a plurality of selection circuits that correspond to the individual states. The N selection circuits groups are configured so that one of the plurality of selection circuits belonging in one of the N selection circuit groups selects one of the plurality of selection circuits belonging to another selection circuit group among the N selection circuit groups in conformance to the path data. In this structure, the state that corresponds to the selected one selection circuit is determined to be the state that forms the maximum likelihood path.

Input portions of the plurality of selection circuits belonging in one of the N selection circuit groups and output portions of the plurality of selection circuits belonging in another selection circuit group among the N selection circuit groups are connected through a circuit configuration that corresponds to branches formed between a plurality of states at the time point t =1 (the time point t=1 indicates an arbitrary point in time) and a plurality of states at the time point t=1+1 (the time point t=1+1 indicates a point in time one clock cycle after the time point t=1). Furthermore, by connecting the output portions of two specific selection circuits selected from the plurality of selection circuits belonging in one of the N selection circuit groups with the input portion of one specific corresponding selection circuit belonging in another selection circuit group among the N selection circuit groups via an OR gate, efficient trace-back processing is achieved.

One of the plurality of selection circuits belonging in one of the N selection circuit groups is selected by an external signal at a specific time point. By inputting a signal that indicates the maximum likelihood state from the path selection unit to one of the N selection circuit groups as an external signal after specific calculation processing is completed at the time point that corresponds to the last stage among the truncation stages, the trace-back processing will be implemented by using the selection circuit that corresponds to this maximum likelihood state as a reference and, ultimately, the maximum likelihood path will be obtained.

Furthermore, the selection circuits may be each constituted of a logic gate. Alternatively, they may be each constituted of a path transistor and in that case miniaturization of the circuits is achieved.

In order to achieve the objects described above, in a second aspect of the present invention, a viterbi decoder having a branch metric calculation unit that calculates the likelihood of a branch obtained through a received convolutional code, a path selection unit that adds metrics of the branches extending from the time point t=n to the time point t=n+1 (the time point t=n+1 indicates a point in time one clock cycle after the time point t=n) obtained at the branch metric calculation unit to the path metrics of a plurality of states that a convolutional code may assume at the time point t=n (the time point t=n indicates an arbitrary point in time) and compares path metrics for each state at the time point t=n+1 to select an optimal path for each state at the time point t=n+1, and a path memory unit that stores in memory the path data corresponding to the optimal path for each state at individual points in time. In addition, the path selection unit provided in the viterbi decoder is provided with a first memory for storing metric data corresponding to each state at the time point t=2n (the time point t=2n indicates an arbitrary point in time over two clock intervals) and a second memory for storing metric data corresponding to each state at the time point t=2n+1 (the time point t=2n+1 indicates a time point one clock cycle after the time point t=2n).

By providing one or more path selection circuits in the path selection unit, each of which repeats an operation in which metric data stored in the first memory and the branch metrics are calculated and the calculation results are stored in the second memory and an operation in which the metric data stored in the second memory and the branch metrics are calculated and the calculation results are stored in the first memory at each time point, the results of calculation performed based upon the metric data stored in the first memory at a given time point are stored in the second memory and, at the next point in time, calculation will be performed based upon the metric data stored in the second memory. The results of this calculation will then be stored in the first memory. Thus, it becomes possible to minimize the length of time required for data transfer aside from that required for the calculation processing, to achieve efficient metric calculation.

By providing a plurality of memory areas corresponding to the individual path selection circuits in the first memory and in the second memory, it becomes possible to support an increase in the number of path selection circuits for the purpose of achieving higher speed in metric calculation in a flexible manner.

In order to achieve the objects described above, in a third aspect of the present invention, a viterbi decoder having a maximum likelihood state selection circuit is provided. The maximum likelihood state selection circuits, in turn, is constituted of a first likelihood comparison/selection circuit that selects one state metric with a high degree of likelihood from a plurality of state metrics, a second likelihood comparison/selection circuit that compares the likelihood of the one state metric against the likelihood of another state metric and selects the state metric with the higher degree of likelihood and a holding circuit that holds the state metric selected at a second likelihood comparison/selection circuit and outputs it as another state metric with a specific timing. In this structure, since the elimination system is implemented for the state metric obtained through the comparison/selection operation performed at the first likelihood comparison/selection circuit and the state metric obtained through the next comparison/selection operation, the maximum likelihood state is determined at the point in time at which all the state metrics have been input to the first likelihood comparison/selection circuit. Thus, it is possible to obtain the maximum likelihood state through a reduced number of operations while minimizing the extent to which the scale of the circuit for implementing comparison and selection of state metrics is increased. In addition, since this structure makes it possible to start a comparison/selection operation without having to wait for all the state metrics that are to be compared for selection to be ready, faster decoding is achieved. Furthermore, since only the state metrics that have survived the elimination process need to be stored at the holding circuit, a reduction in power consumption is achieved.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments. In the drawings.

DETAILED DESCRIPTION OF THE PREFERRED EMBODIMENTS

The following is a detailed explanation of the preferred embodiments of the viterbi decoder according to the present invention in reference to the attached drawings. It is to be noted that in the following description, the same reference numbers are assigned to components having practically identical functions and structures to preclude the necessity for repeating explanation thereof.

First Embodiment

Figure 1:
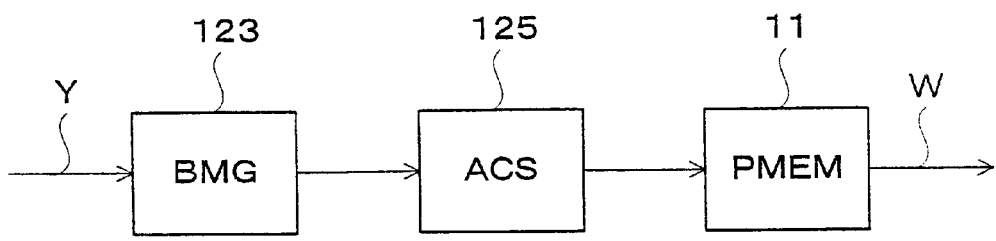
FIG. 1 is a block diagram illustrating the structure of the viterbi decoder in a first embodiment of the present invention.
Figure 17:
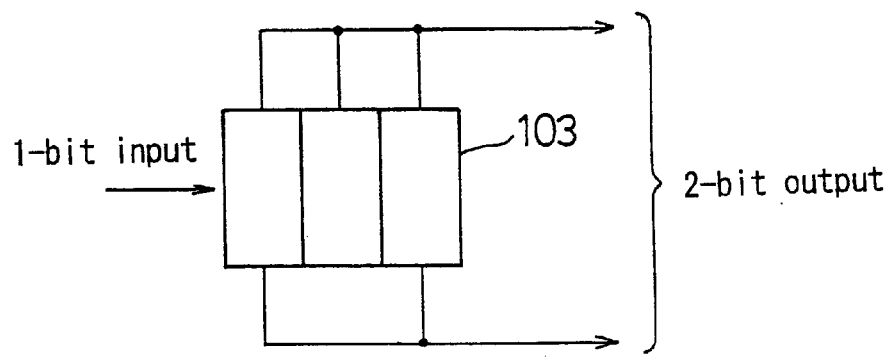
FIG. 17 is a block diagram illustrating a schematic structure of a convolutional encoder.

FIG. 1 shows a viterbi decoder 1 in the first embodiment which is employed to perform maximum likelihood decoding on a code sequence Y generated by a convolutional encoder 101 illustrated in FIG. 17. This viterbi decoder 1 is constituted by replacing the PMEM 127 in the viterbi decoder 121 in the prior art with a PMEM 11.

Figure 2:
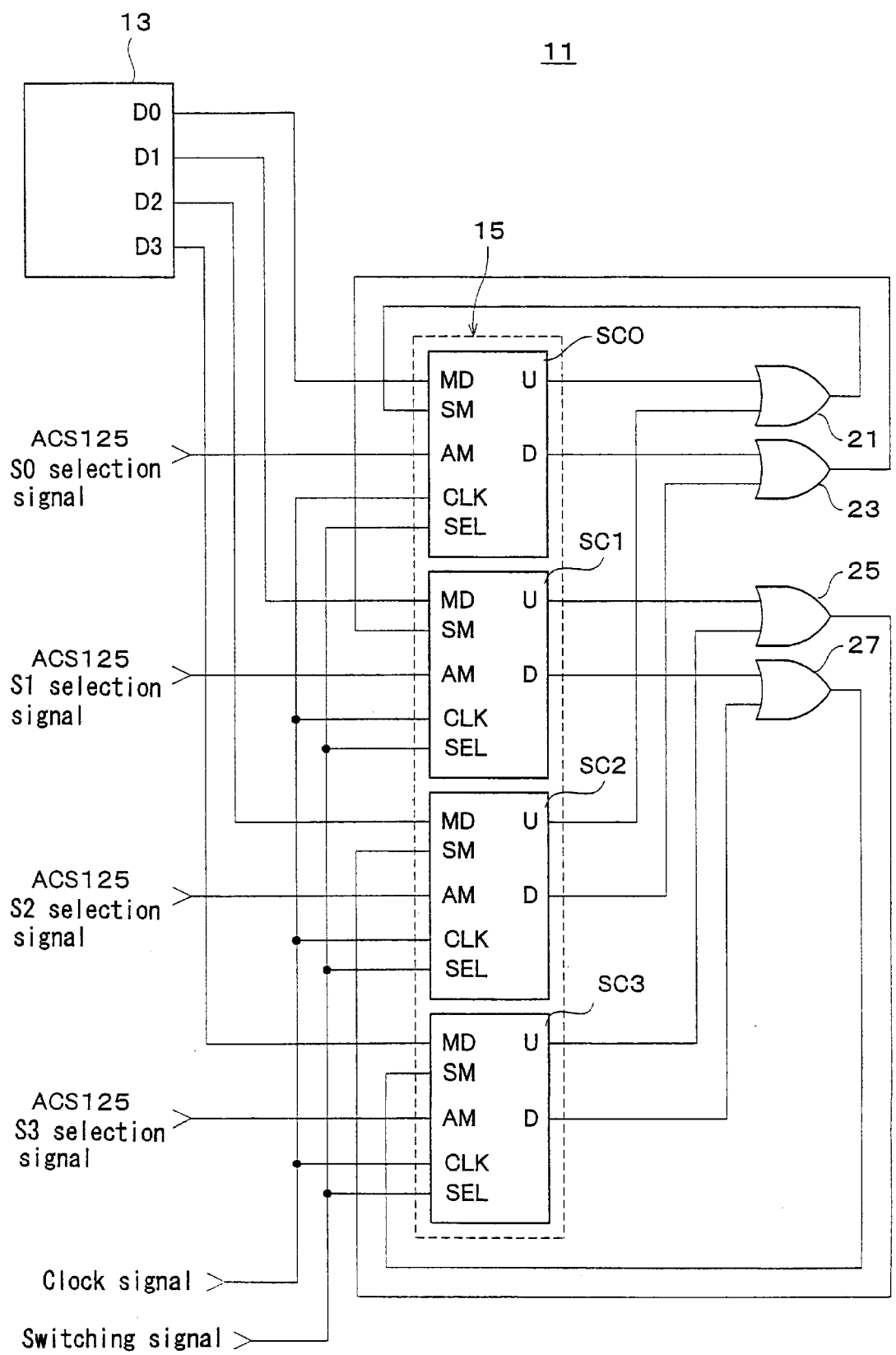
FIG. 2 is a circuit diagram illustrating the schematic structure of the PMEM in the viterbi decoder shown in FIG. 1.

As illustrated in FIG. 2, the PMEM 11 is constituted of a memory unit 13, a selection circuit group 15 and OR gates 21, 23, 25 and 27. It is to be noted that the selection circuit group 15 is constituted by providing in parallel selection circuits SC0, SC1, SC2 and SC3 that correspond to states S0, S1, S2 and S3 respectively.

A state S0 selection signal, a state S1 selection signal, a state S2 selection signal and a state S3 selection signal provided by an ACS 125 are input to the AM inputs of the selection circuits SC0, SC1, SC2 and SC3 respectively, with the MD inputs of the selection circuits SC0, SC1, SC2 and SC3 respectively connected to the D0, D1, D2 and D3 input/outputs at the memory unit 13. A clock signal provided by an oscillator or the like (not shown) that is provided separately is commonly input to the CLK inputs of the selection circuits SC0–SC3, and a specific switching signal is input to their SEL inputs.

In addition, one of the inputs of the OR gate 21 is connected with the U output of the selection circuit SC0, whereas the U output of the selection circuit SC2 is connected to its other input. One of the inputs of the OR gate 23 is connected with the D output of the selection circuit SC0, whereas the D output of the selection circuit SC2 is connected to its other input. One of the inputs of the OR gate 25 is connected with the U output of the selection circuit SCI, whereas the U output of the selection circuit SC3 is connected to its other input. One of the inputs of the OR gate 27 is connected with the D output of the selection circuit SC1, whereas the D output of the selection circuit SC3 is connected to its other input. Furthermore, the outputs of the OR gates 21, 23, 25 and 27 are respectively connected to the SM inputs of the selection circuits SC0, SC1, SC2 and SC3.

Figure 3:
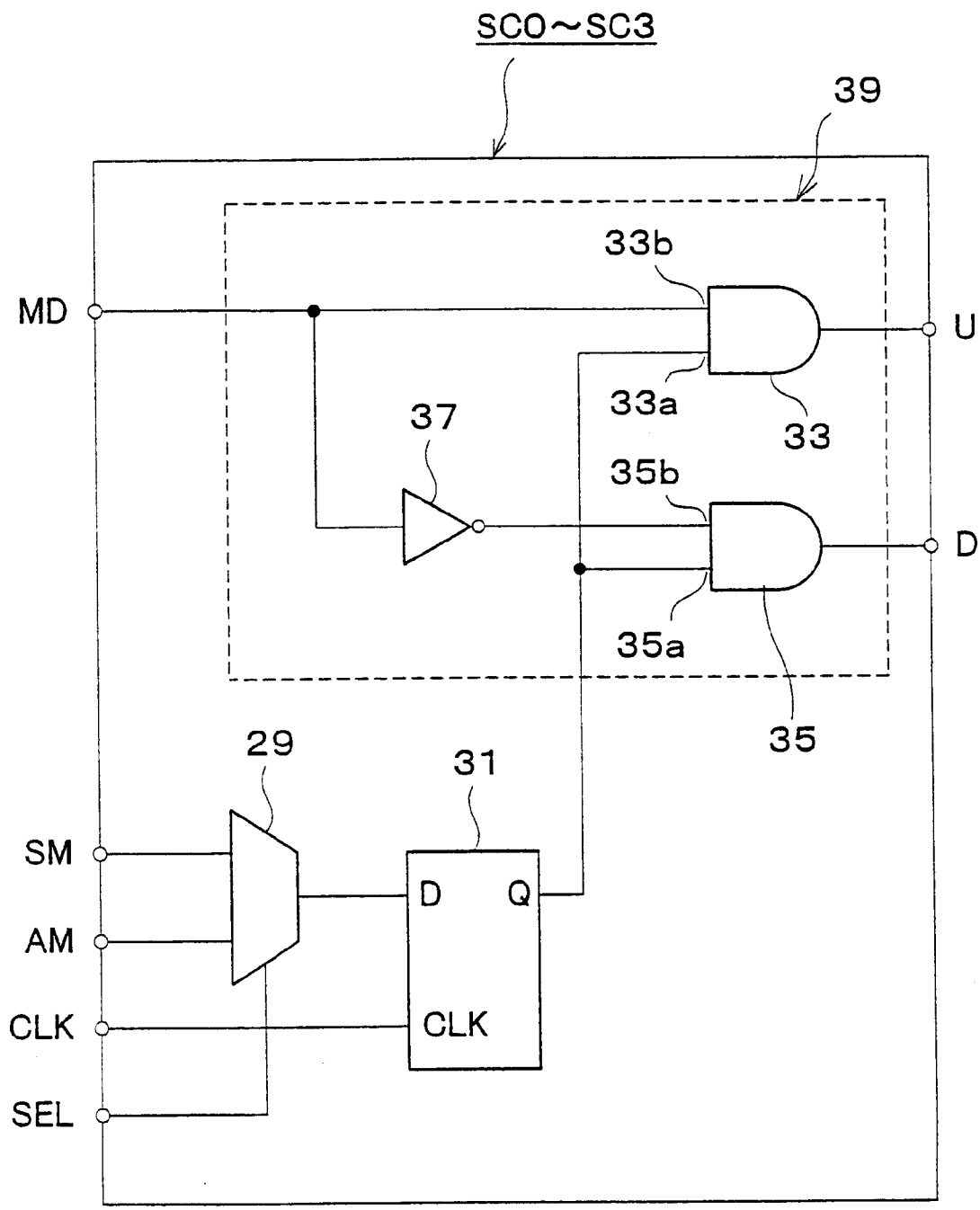
FIG. 3 is a circuit diagram illustrating the circuit structure of a selection circuit in the PMEM shown in FIG. 2.

Now, the selection circuits SC0–SC3 have circuit structures that are practically identical to one another, and are each provided with a selector 29, a D-flip-flop 31 and a gate circuit portion 39 as illustrated in FIG. 3. In addition, the gate circuit portion 39 is provided with AND gates 33 and 35 and a NOT gate 37.

The SM input and the AM input are connected to the two inputs of the selector 29, and the selector 29 has a function for selecting/outputting either the signal provided through the SM input or the signal provided through the AM input by using the switching signal provided through the SEL input. In addition, the output of the selector 29 is connected to the D input of the D-flip-flop 31 which is provided at a rear stage.

A clock signal is input to the CLK input of the D-flip-flop 31 via the CLK input in each of the selection circuits SC0–SC3. In addition, the Q output of the D-flip-flop 31 is commonly connected to one of the inputs of the AND gate 33, i.e., the input 33a and one of the inputs of the AND gate 35, i. e., the input 35a, both of which are part of the gate circuit portion 39.

Furthermore, the MD input in each of the selection circuits SC0–SC3 is connected to another input 33b of the AND gate 33, and is also connected to another input 35b of the AND gate 35 via the NOT gate 37.

In addition, the memory capacity of the memory unit 13 illustrated in FIG. 2 corresponds to the number of the states SC0–SC3 and the number of stages of truncation T determined by the constraint length K. As explained earlier, since the constraint length K at the convolutional encoder 101 is set at 3, the number of states S is calculated as $2^{K-1}=4$. Furthermore, since the number of stages of truncation T is 5–6 times the constraint length K under normal circumstances as explained earlier, the number of stages of truncation T in this example may be calculated at K×6=18 stages. Consequently, the memory capacity of the memory unit 13 is calculated to be 4(the number of states) bits×18 (the number of stages of truncation T) words.

Now, the operation of the viterbi decoder 1 structured as described above is explained. Every time a code sequence Y is input to the viterbi decoder 1, the ACS 125 selects a branch for each of the states SC0–SC3 by using the results of the calculation performed at the BMG 123. As the trellis chart 111 presented in FIG. 18 clearly demonstrates, two branches are connected to each of the states SC0–SC3, and the ACS 125 selects either of the two branches, with the results of the selection written into the memory unit 13 within the PMEM 11 at a size of one bit. It is to be noted that the explanation given below on the current embodiment relates to a case in which the results of branch selection at the time points t=0–17 are written by updating the address in the memory unit 13 through A=0–17 sequentially.

When the write of the results of the branch selection into the memory unit 13 is completed, trace-back processing for narrowing down the data within the memory unit 13 for error correction and decoding of the reception sequence Y is commenced.

At the start of the trace-back processing, the ACS 125 selects the state with the highest degree of likelihood (hereafter referred to as the "maximum likelihood state") among the four states SC0–SC3, and sets only the selection circuit SC corresponding to the selected maximum likelihood state in an active state. For instance, if the ACS 125 selects the state S0 as the maximum likelihood state at the time point t=17, a "1" is input only to the AM input of the selection circuit SC0 corresponding to the state S0, with "0" input to the AM inputs of the selection circuits SC1, SC2 and SC3 that correspond to states other than the state S0, i. e., the states S1, S2 and S3.

At this point, the selectors 29 in all the selection circuits SC0–SC3 are set to select/output the signal input to the AM inputs by using the switching selection signal, and the signals input to the AM inputs are caused to synchronize with the clock signal CLK at the D-flipflops 31 before being input to the inputs 33*a* and 35*a* of the AND gates 33 and 35. As a result, when "1" is input to the AM input of the selection circuit SC0 and "0" is input to the AM inputs of the selection circuits SC1, SC2 and SC3 as described above, only the MD input of the selection circuit SC0 among the selection circuits SC0–SC3 enters an active state, so that a signal that corresponds to the signal input to the MD input is output through the U output or the D output of the selection circuit SC0. However, "0" is output through the U outputs and the D outputs of the rest of the selection circuits SC1, SC2 and SC3, regardless of the logic of the signal input through their MD inputs.

As explained above, at the start of the trace-back processing, an address A=17 is provided for the memory unit 13 after the setting of the selection circuits SC0–SC3 is completed. Then, the data at the address A=17 are output through the D0–D3 input/outputs of the memory unit 13. These data indicate the branch selected by the ACS 125 from the two branches connected to each of the states SC0–SC3 at the time point t=17 continuously from the time point t=16. For instance, if the ACS 125 selects the branch from the state S1 of the two branches connecting to the state S0 at the time point t=17, one of which comes from the state S0 at the time point t=16 and the other of which comes from the state S1 at the time point t=16, "0" is output from the D0 input/output of the memory unit 13. This causes "0" to be output from the U output of the selection circuit SC0 and "1" to be output through the D output. Now, as explained above, since "0" is output from the U outputs and the D outputs of the selection circuits SC1, SC2 and SC3 regardless of the logic of the signal provided through their MD inputs, i.e., the signal from the D1, D2 and D3 input/outputs of the memory unit 13, ultimately, the OR gate 23 outputs "1" whereas the other OR gates 21, 25 and 27 output "0."

The outputs of the OR gates 21, 23, 25 and 27 are respectively connected to the SM inputs of the selection circuits SC0, SC1, SC2 and SC3, and since only the OR gate 23 is currently outputting "1," as explained above, a decision is made that the maximum likelihood state at the time point t=16 immediately preceding the time point t=17 is the state S1 that corresponds to the selection circuit SC1.

It is to be noted that, as the trellis chart 111 clearly shows, the state S0 at a given point in time t is connected with two branches at the time point t−1 immediately preceding the time point t. Likewise, two branches continuous from the states S2 and S3 are connected to the state S1 from the states S2 and S3, two branches continuous from the states S0 and S1 are connected to the state S2 and two branches continuous from the states S2 and S3 are connected to the state S3. The OR gates 21, 23, 25 and 27 in the PMEM 11 are provided to achieve the branch structure described above, and have a function for combining the outputs from the selection circuits SC0–SC3 during the trace-back processing.

Next, the address A=17 at the memory unit 13 is reduced by 1 to A=16. Then, the selectors 29 in the selection circuits SC0–SC3 are switched so that the signals input to the SM inputs are selected. At this point, since "1" is input only to the SM input of the selection circuit SC1 and "0" is input to the SM inputs of the other selection circuits SC0, SC2 and SC3, only the selection circuit SC1 enters an active state. As a result, the signal corresponding to the data D1 at the address A=16 at the memory unit 13 is output through the U outputs and the D outputs of the selection circuit SC1, whereas "0" is output through the U output or the D output of the selection circuits SC0, SC2 and SC3. Based upon this, the maximum likelihood state is selected from among the states SC0–SC3 at the time point t=15.

Subsequently, the address at the memory unit 13 is sequentially reduced by one starting from A=17 to A=0 and the trace-back processing in which the sequence of the processing described above is repeated continues to finally determine the maximum likelihood path.

The viterbi decoder 1 in this embodiment, which is structured and operates as described above, achieves the following advantages. It is to be noted that in the viterbi decoder 121 in the prior art, the number of unit path memories 131 must be increased in correspondence to an increase in the constraint length K or an increase in the number of stages of truncation T.

In contrast, the viterbi decoder 1, which is structured so that the selection circuits SC0–SC3 corresponding to the states S0–S3 are repeatedly used, is capable of supporting an increase in the number of stages of truncation T with ease without having to increase the circuit scale, simply by providing at the memory unit 13 of the PMEM 11 words, the number of which corresponds to the required number of stages of truncation T.

In addition, when the constraint length K is increased in order to improve the error correction capability, too, such an increase in the constraint length K can be supported by adding a specific number of selection circuits. In other words, high quality data communication is achieved while holding the extent of increase in the circuit scale to an absolute minimum.

Furthermore, while all the unit path memories 131 operate every time the time point t shifts during decoding in the prior art, only the address subtracting processing at the memory unit 13 and the operations of the selection circuits SC0–SC3 are performed in the viterbi decoder 1 in the first embodiment, thereby greatly reducing the power consumption of the entire circuit.

Second Embodiment

Figure 4:
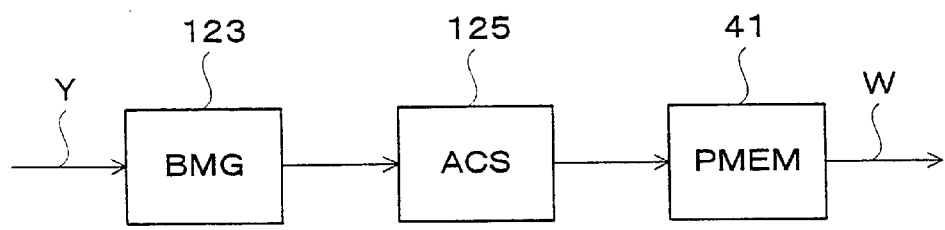
FIG. 4 is a block diagram illustrating the structure of the viterbi decoder in a second embodiment of the present invention.

The viterbi decoder 3 in the second embodiment is constituted by replacing the PMEM 11 in the viterbi decoder in the first embodiment with a PMEM 41, as illustrated in FIG. 4.

Figure 5:
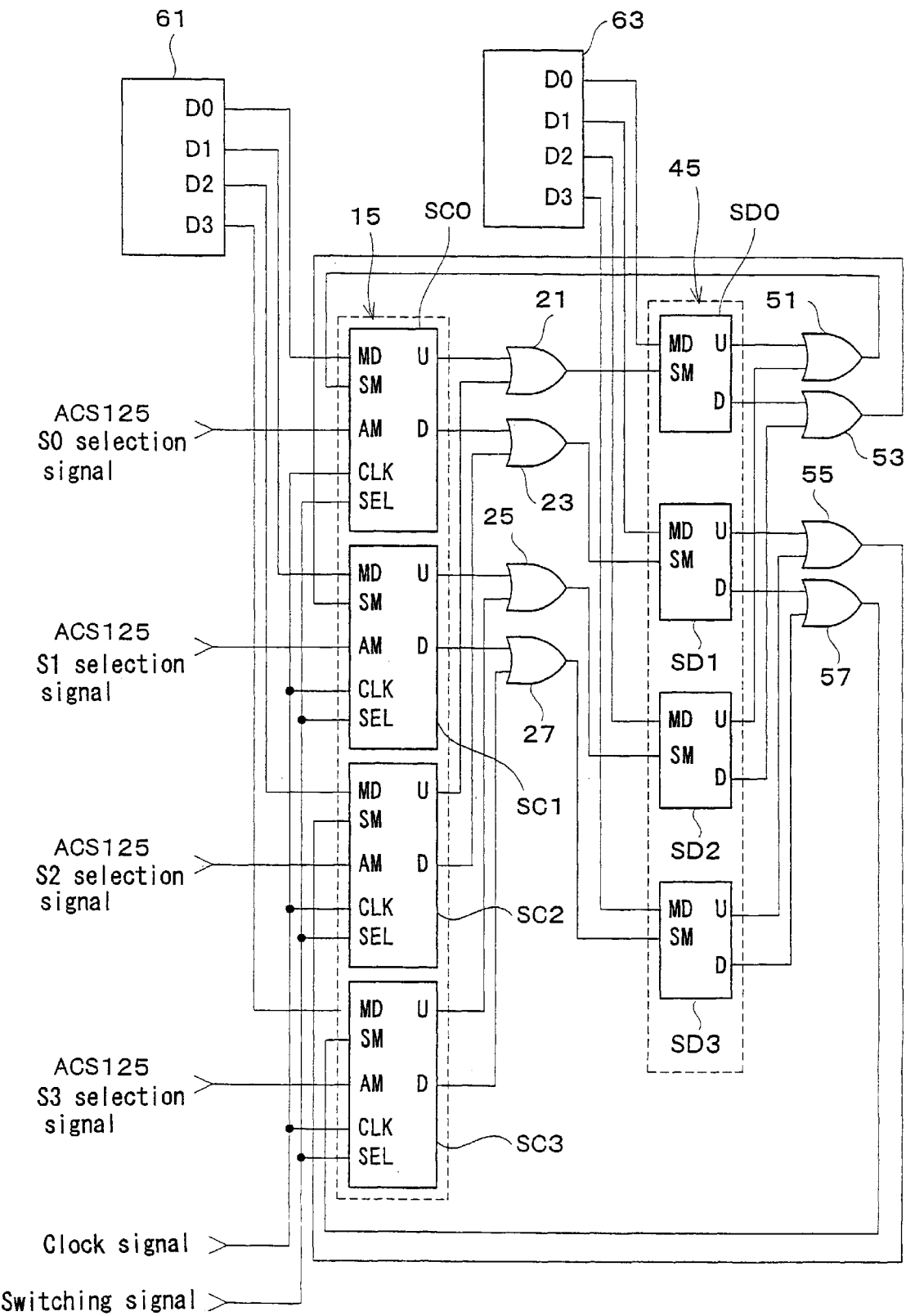
FIG. 5 is a circuit diagram illustrating the schematic structure of the PMEM in the viterbi decoder shown in FIG. 4.

As shown in FIG. 5, the PMEM 41 is provided with a selection circuit group 15 and OR gates 21, 23, 25 and 27, all identical to those in the PMEM 11, and is also provided with a selection unit group 45, OR gates 51, 53, 55 and 57, a first memory unit 61 and a second memory unit 63. It is to be noted that the selection unit group 45 is constituted by providing in parallel selection units SD0, SD1, SD2 and SD3 corresponding to the states S0, S1, S2 and S3 respectively.

In addition, as in the PMEM 11 in the first embodiment, state S0, S1, S2 and S3 selection signals provided by the ACS 125 are respectively input to the AM inputs of the selection circuits SC0, SC1, SC2 and SC3 constituting the selection circuit group 15, with a clock signal input to their CLK inputs and a specific switching signal input to their SEL inputs.

The D0, D1, D2 and D3 input/outputs of the first memory unit 61 are respectively connected to the MD inputs of the selection circuits SC0, SC1, SC2 and SC3.

Furthermore, the U outputs and the D outputs of the selection circuits SC0–SC3 are connected to the inputs of the OR gates 21–27 in a manner identical to that employed to achieve the connections in the PMEM 11 in the first embodiment.

The D0, D1, D2 and D3 input/outputs of the second memory unit 63 are respectively connected to the MD inputs of the selection units SD0, SD1, SD2 and SD3 constituting the selection unit group 45, whereas the outputs of the OR gates 21, 23, 25 and 27 are respectively connected to their SM inputs.

In addition, the U output of the selection unit SD0 is connected to one of the inputs of the OR gate 51, with the other input of the OR gate 51 connected with the U output of the selection unit SD2. The D output of the selection unit SD0 is connected to one of the inputs of the OR gate 53, with the other input of the OR gate 53 connected with the D output of the selection unit SD2. The U output of the selection unit SD1 is connected to one of the inputs of the OR gate 55, with the other input of the OR gate 55 connected with the U output of the selection unit SD3. The D output of the selection unit SD1 is connected to one of the inputs of the OR gate 57, with the other input of the OR gate 57 connected with the D output of the selection unit SD3.

The outputs of the OR gates 51, 53, 55 and 57 are respectively connected to the SM input of the selection circuits SC0, SC1, SC2 and SC3.

Figure 6:
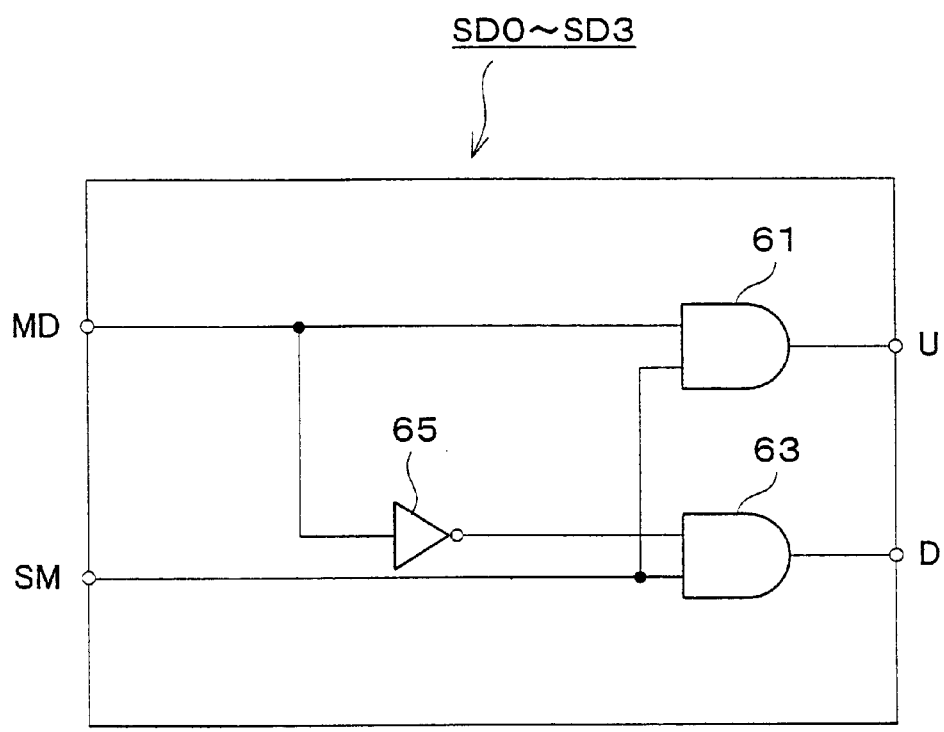
FIG. 6 is a circuit diagram illustrating the circuit structure of a selection unit in the PMEM shown in FIG. 5.

The selection units SD0–SD3 constituting the selection unit group 45 are each constituted of AND gates 61 and 63 and a NOT gate 65, as illustrated in FIG. 6. The MD input in each of the selection units SD0–SD3 is connected to one of the inputs of the AND gate 61, and is also connected to one of the inputs of the AND gate 63 via the NOT gate 65. The SM input at each of the selection units SD0–SD3 is commonly connected to another input of the AND gate 61 and another input of the AND gate 63. The output of the AND gate 61 is connected to the U output in each of the selection units SD0–SD3, whereas the output of the AND gate 63 is connected to the D output in each of the selection units SD0–SD3.

The memory capacities of the first memory unit 61 and the second memory unit 63 are both set at half the memory capacity of the memory unit 13 in the PMEM 11, i. e., 4 bits×9 words.

In the viterbi decoder 3 structured as described above, each time a reception sequence Y is input, the ACS 125 selects a branch at each of the states S0–S3 by using the results of the calculation performed at the BMG 123. The results of the selections are written alternately in the first memory unit 61 and the second memory unit 63 at the PMEM 41 at the size of one bit. In other words, the results of the selection made at the time point t=0 are written at an address A=0, for instance, in the second memory unit 63 and the results of the selection made at the time point t=1 are written at an address A=0, for instance, in the first memory unit 61. Then, the addresses A in both the first memory unit 61 and the second memory unit 63 are updated by one, so that the results of selection made at the time point t=2 are written at an address A=1 in the second memory unit 63 with the results of the selection made at the time point t=3 written at an address A=1 in the first memory unit 61. After this, identical processing is repeated and ultimately, the results of the selections made by the ACS 125 at the time points t=0, 2, 4 . . . 14, 16 and the results of the selections made by the ACS 125 at the time points t=1, 3, 5 . . . 15, 17, which correspond to the 18 stages of truncation T, are respectively stored at addresses A=0–8 in the second memory unit 63 and at addresses A=0–8 in the first memory unit 61.

After the write of all the results of the selections made at the time point t=0–17 is completed in this manner, the trace-back processing is commenced.

At the start of the trace-back processing, as in the viterbi decoder 1 described earlier, the ACS 125 selects the maximum likelihood state from among the four states S0–S3 at time point t=17. Then, "1" is input to the AM input of one of the selection circuits SC0–SC3 that corresponds to the maximum likelihood state, with "0" input to the AM inputs of the selection circuits SC0–SC3 corresponding to the state other than the maximum likelihood state.

In addition, an address A=8 is provided for both the first memory unit 61 and the second memory unit 63, so that the results of the selection of the branches from the time point t=16 to t=17 made by the ACS 125 are output from the D0–D3 input/outputs of the first memory unit 61 and that the results of the selections of the branches from the time point t=16 to t=17 made by the ACS 125 are output from the D0–D3 input/outputs of the second memory unit 63.

For instance, if the ACS 125 selects the state S0 as the maximum likelihood state at the time point t=17, "1" is input to the AM input of the selection circuit SC0 and "0" is input to the AM inputs of all the other selection circuits SC1, SC2 and SC3.

Furthermore, if the ACS 125 selects the branch continuous from the state S1 of the two branches connected to the state S0 at the time point t=17, one of which is continuous from the state S0 at the time point t=16 and the other of which is continuous from the state S1 at the time point t=16, "0" is output from the D0 input/output of the first memory unit 61.

At this point, the selectors at all the selection circuits SC0–SC3 are set to select/output the signals input to the AM inputs by a specific switching signal. Consequently, when "1" is input to the AM input of the selection circuit SC0, "0" is input to the AM inputs of the selection circuits SC1, SC2 and SC3 and "0" is output through the D0 input/output of the first memory unit 61, as described above, only the D output of the selection circuit SC0 among the selection circuits SC0–SC3 outputs "1" with "0" output through all the other outputs, i.e., the U output of the selection circuit SC0 and the U outputs and the D outputs of the selection circuits SC1, SC2 and SC3. This causes the OR gate 23 to output "1" and the other OR gates 21, 25 and 27 to output "0." Based upon the output from the OR gates 21–27, the path continuous from the state S1 at the time point t=16 is determined to be the maximum likelihood path reaching the maximum likelihood state S0 at the time point t=17 selected by the ACS 125.

The outputs of the OR gates 21–27 are respectively connected to the SM inputs of the selection units SD0–SD3 that are provided at a rear stage. As a result, "1"is input only to the SM input of the selection unit SD1 which corresponds to the state S1, with "0" input to the SM input of the selection units SD0, SD2 and SD3 corresponding to the other states S0, S2 and S3 respectively.

If the ACS 125 selects the branch continuous from the state S2, for instance, of the two branches connected to the state S1 at the time point t=16, one of which is continuous from the state S2 at the time point t=15 and the other of which is continuous from the state S3 at the time point t=15, "1" is output through the D1 input/output of the second memory unit 61.

Thus, based upon the signal level "1" input to the SM input of the selection unit SD1 and the output signal "1" output through the D1 input/output of the second memory unit 63, "1" is output only through the U output of the selection unit SD1 among the U/D outputs of the selection units SD0–SD3 and "0" is output through the other outputs, i.e., the D output of the selection unit SC1, and the U outputs and the D outputs of the selection units SC0, SC2 and SC3. This causes the OR gate 55 to output "1" and the other OR gates 51, 53 and 57 to output "0." These outputs from the OR gates 51–57 indicate which state at the time point t=15 the branch that is connected to the maximum likelihood path determined by the OR gates 21–27 originated.

Next, 1 is subtracted from the addresses A=8 in the first memory unit 61 and the second memory unit 63 so that A=7. Then, a specific switching signal is provided to the selection circuit group 15 so that the signals input to the SM inputs are selected by the selectors 29 in the selection circuits SC0–SC3. This causes the outputs from the OR gates 21–27 to indicate from which state at the time point t=14 the branch connected to the maximum likelihood path at the time points t=15–17 originates, and also causes the outputs from the OR gates 51–57 to indicate from which state at the time point t=13 the branch connected to the maximum likelihood path at the time points t=14–17 originates.

After this, the addresses at the first memory unit 61 and the second memory unit 63 are sequentially reduced by one from A=8 to A=0 and the trace-back processing, in which the sequence of the processing described above is repeated, continues to finally determine the maximum likelihood path.

As explained above, in addition to the advantages identical to those achieved by the viterbi decoder 1 in the first embodiment, the viterbi decoder 3 in the second embodiment achieves the following unique advantages over the viterbi decoder 121 in the prior art. Namely, with the viterbi decoder 3 in the second embodiment, time can be traced back by two points in one cycle of the clock signal CLK during the trace-back processing. As a result, the trace-back processing can be completed in a length of time that is ½ that required in the viterbi decoder 1 in the first embodiment.

In addition, the circuit of the viterbi decoder 3 is achieved by replacing the memory unit 13 of the viterbi decoder 1 with the first memory unit 61 and the second memory unit 63 and adding the selection unit group 45 and the OR gates 51–57 in the structure of the viterbi decoder 1. However, since the first memory unit 61 and the second memory unit 63 may be achieved by dividing the memory area of the memory unit 13 into two areas, the actual increase in the circuit scale of the viterbi decoder 3 represents only the increase necessitated by the addition of the selection unit group 45 and the OR gates 51–57. Consequently, the viterbi decoder 3 achieves a great reduction in the length of time required for the trace-back processing with a minimal increase in its circuit scale. Furthermore, a reduction in the circuit power consumption required for the trace-back processing can be expected.

It is to be noted that while the explanation given above on the second embodiment relates to a case in which the results of the branch selection performed by the ACS 125 are stored in two separate memory units provided within the PMEM 41, i.e., in the first memory unit 61 and in the second memory unit 63, the present invention is not restricted to this structure, and three or more memory units may be provided to divide and store the branch selection results in the individual memory units.

For instance, while, when N memory units are provided to store the branch selection results that are divided into N sets in those N memory units, it is necessary to connect in series one selection circuit group 15 and (N−1) selection unit groups 45, as is obvious from the explanation given above, the trace-back processing can be completed in a length of time that is 1/N of that required in the viterbi decoder 1 in the first embodiment, as long as the circuit is structured in this manner, to achieve a further reduction in the trace-back processing time.

Third Embodiment

The gate circuit portions 39 provided in the selection circuits SC0–SC3 in the viterbi decoder 1 in the first embodiment and in the viterbi decoder 3 in the second embodiment, and the selection units SD0–SD3 in the viterbi decoder 3 in the second embodiment are structured almost identically to each other. To explain in more detail, the gate circuit portions 39 are each constituted of two AND gates 33 and 35 and one NOT gate 37, and the selection units SD0–SD3 are each constituted of two AND gates 61 and 63 and one NOT gate 65.

In place of the gate circuit portions 39 and/or the selection units SD0–SD3, a FET circuit 71 constituted of a plurality of FETs (field effect transistors) may be provided.

Figure 7:
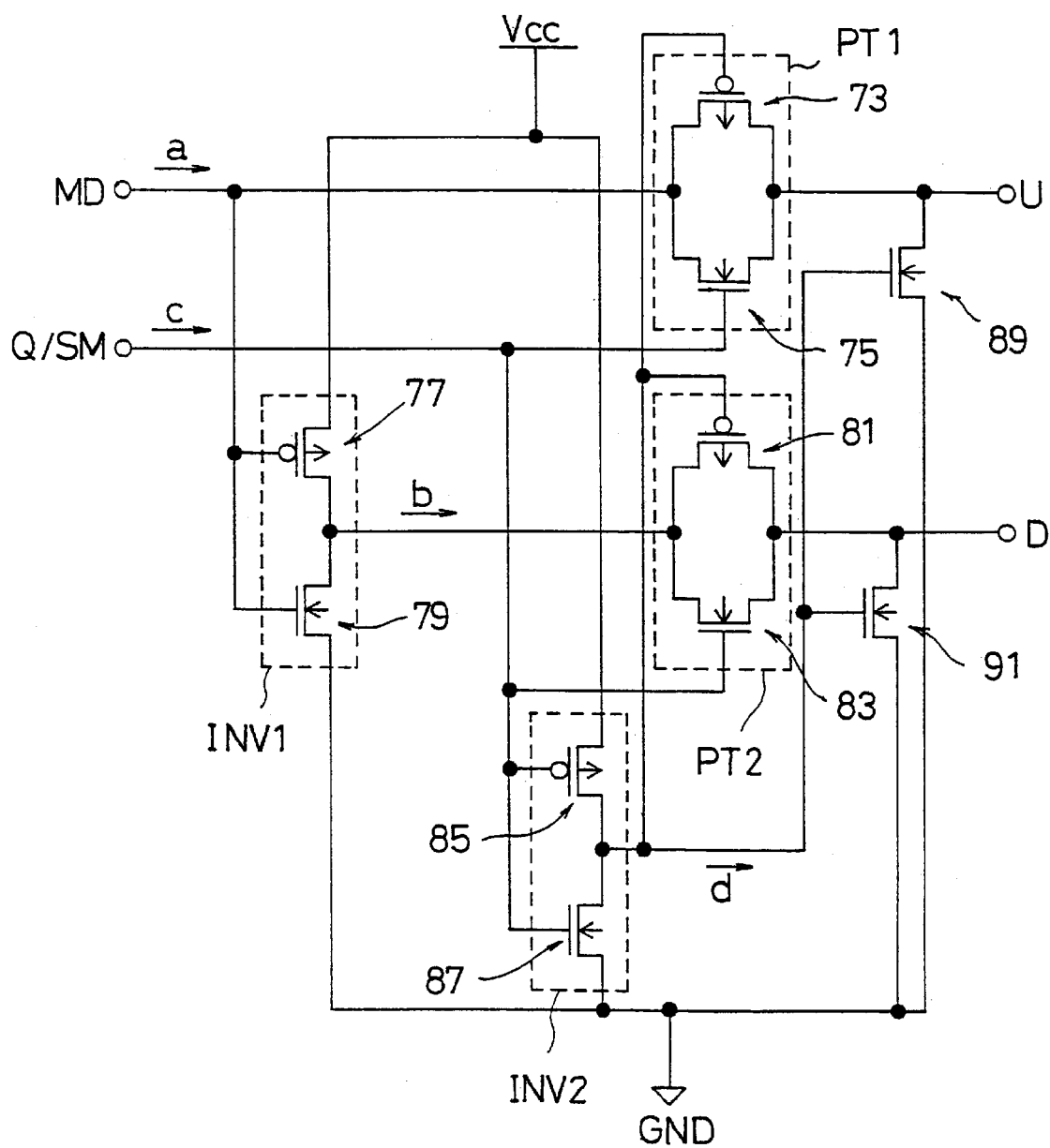
FIG. 7 is a circuit diagram of the FET circuit employed in the viterbi decoder in a third embodiment of the present invention.

FIG. 7 illustrates the structure of the FET circuit 71. A P-channel FET 73 and an N-channel FET 75 constitute a path transistor PT1 to provide an input signal "a" from the MD input to the U output.

A P-channel FET 77 and an N-channel FET 79 form an inverter circuit INV1 which inverts the logic of the input signal "a" from the MD input. The inverted signal "b" achieved by inverting the logic of the input signal a is then provided to the D output via a path transistor PT2 constituted of a P-channel FET 81 and an N-channel FET 83.

A P-channel FET 85 and an N-channel FET 87 constitute an inverter circuit INV2 to invert the logic of an input signal "c" from the Q input or the SM input. The inverted signal "d" achieved through the inversion controls the path transistor PT1 and the path transistor PT2 together with the pre-inversion input signal "c."

The inverted signal "d" achieved by the inverter circuit INV2 is input to the gates of an N-channel FET 89 and a N-channel FET 91.

If the input signal "c" from the Q input or the SM input is set to "1" in this structure, the inverted signal "d" generated at the inverter circuit INV2 is set to "0" and, consequently, the path transistor PT1 and the path transistor PT2 both enter an on state. Consequently, the input signal "a" from the MD input is output through the U output and the inverted signal "b" of the input signal "a" is output through the D output.

In contrast, if the input signal "c" from the Q input or the SM input is set to "0," the inverted signal "d" generated at the inverter circuit INV2 is set to "1" and, as a result, the path transistor PT1 and the path transistor PT2 both enter an off state. Thus, the input signal "a" from the MD input and the inverted signal "b" of the input signal "a" are not communicated to the rear stages of the path transistors PT1 and PT2 respectively. Now, since the inverted signal "d" generated at the inverter circuit INV2 is set to "1," the U output and the D output become grounded by the N-channel FET 89 and the N-channel FET 91. In other words, when the input signal "c" is set to "0," the U output and the D output are fixed at "0" regardless of the logic of the input signal "a."

As explained above, the FET circuit 71 achieves a reduction in the circuit scale at the transistor level while maintaining a function that is almost identical to that fulfilled by the gate circuit portions 39 and the selection units SD0–SD3. Namely, while a circuit such as in each of the gate portions 39, constituted of the AND gates 33 and 35 and the NOT gate 37, requires 7 P-channel FETs and 7 N-channel FETs under normal circumstances, the FET circuit 71 is achieved by employing four P-channel FETs and six N-channel FETs. Consequently, the number of P-channel FETs is reduced by three and the number of N-channel FETs is reduced by one to achieve a reduction in the circuit scale.

Moreover, the level of the through current flowing from the source Vcc to the ground GND in the FET circuit 71 is reduced due to the effect achieved by the inverter circuits INV1, the inverter circuit INV2 and the like, thereby achieving energy saving in the entire circuit in addition to a reduction in the number of FETs explained above.

Fourth Embodiment

Figure 8:
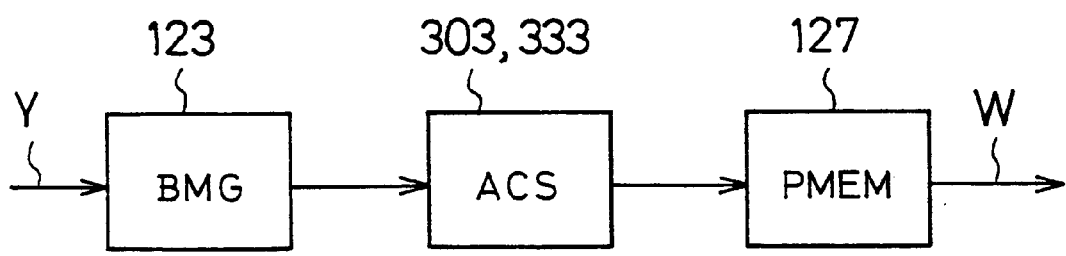
FIG. 8 is a block diagram illustrating the structure of the viterbi decoder in a fourth embodiment and fifth embodiments of the present invention.

The following is an explanation of a viterbi decoder 301 in the fourth embodiment. This viterbi decoder 301 is constituted by replacing the ACS 125 in the viterbi decoder 121 in the prior art with an ACS 303, as illustrated in FIG. 8. It is to be noted that the viterbi decoder 301 explained in reference to this embodiment decodes coded words encoded at an rate R=½ and a constraint length K=3.

Figures 9, 10:
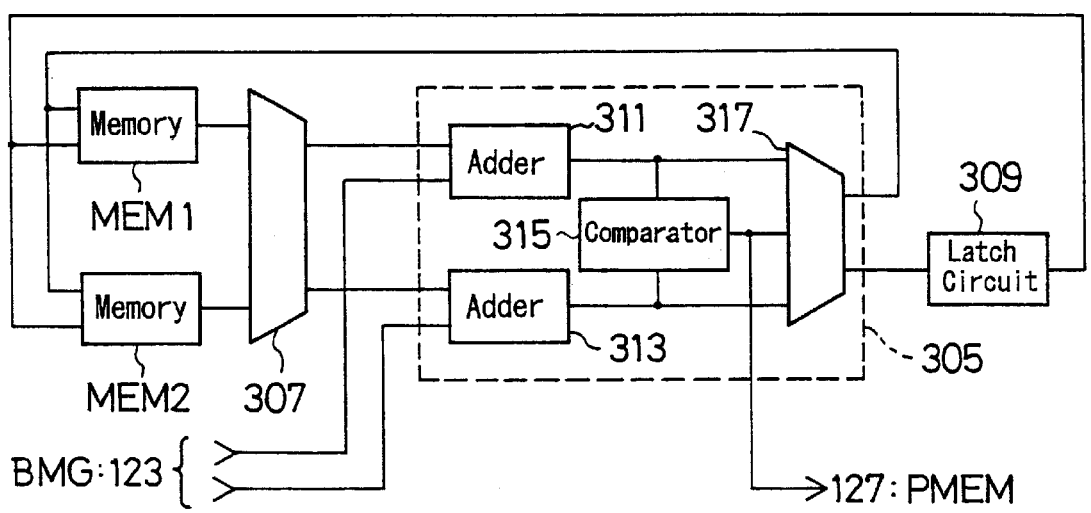
FIG. 9 is a circuit diagram illustrating the internal structure of the ACS provided in the viterbi decoder in the fourth embodiment of the present invention.
FIG. 10 illustrates a memory map in the memory provided in the ACS shown in FIG. 9.

The ACS 303 is structured so that state metric calculation is performed by a single ACS circuit 305, as illustrated in FIG. 9, to achieve a reduction in the circuit scale. In addition, the ACS 303 is provided with two memories MEM1 and MEM2 for storing state metrics obtained through the calculation performed by the ACS circuit 305, a selection circuit 307 that selectively provides the data read out from the memory MEM1 and the MEM2 to the ACS circuit 305 and a latch circuit 309 that temporarily stores the data output from the ACS circuit 305.

Figure 21:
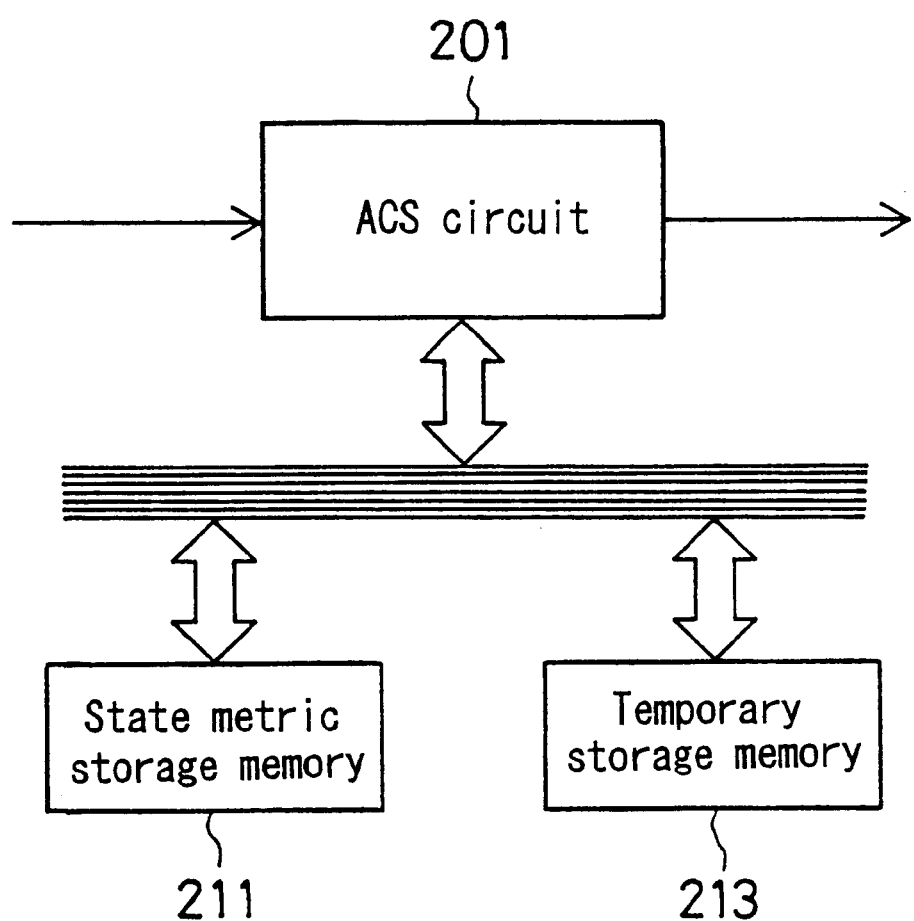
FIG. 21 is a circuit diagram illustrating a schematic structure of the ACS provided in the viterbi decoder shown in FIG. 19.

The ACS circuit 305 is structured almost identically to the ACS circuit 201 in the prior art as illustrated in FIG. 21 and is provided with two adders 311 and 313, a comparator 315 and a selector 317.

The memory MEM1 and the memory MEM2 are structured almost identically to each other, and FIG. 10 illustrates their memory map. An address 0 is allocated for the metric for the state S0 and the metric for the state S1, whereas an address 1 is allocated for the metric for the state S2 and the metric for the state S3.

Now, a detailed explanation is given on the connections of the components of the ACS 303. The branch metric from the BMG 123 and the state metrics stored in the memories MEM1 and MEM2 are input to each of the adders 311 and 313. The outputs from the adder 311 and the adder 313 are input to the comparator 315 and are also input to the selector 317. The comparator 315 is constituted in such a manner that it is capable of comparing the degree of likelihood of the output data from the adder 311 and the output data from the adder 313 that have been input and outputting a selection signal to the selector 317 and the PMEM 127. One of the outputs of the selector 317 is connected to the memory MEM1 and the memory MEM2, with another output thereof connected to the latch circuit 309. The output of the latch circuit 309 is connected to the memory MEM1 and the memory MEM2 as in the case with the other output of the selection circuit 317.

Figure 18:
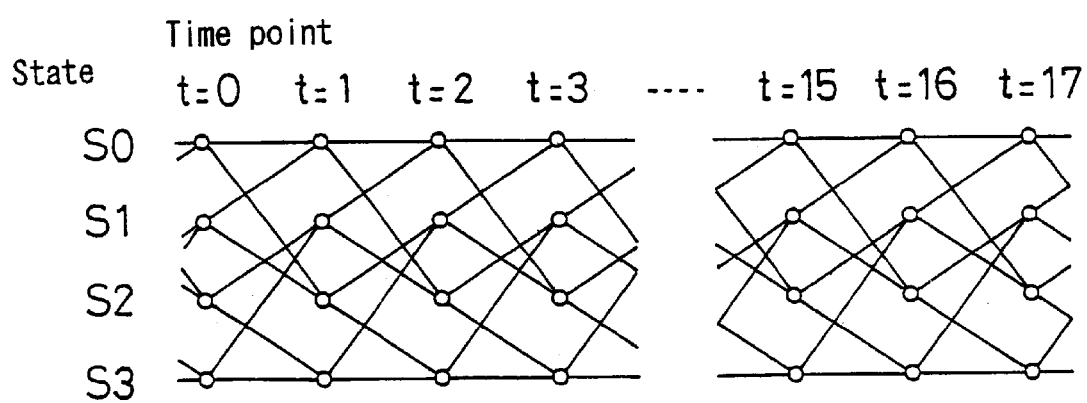
FIG. 18 presents a trellis chart achieved by rendering the generating conventions of convolutional encoding performed by the encoder shown in FIG. 17 as a state transition diagram.
Figure 19:
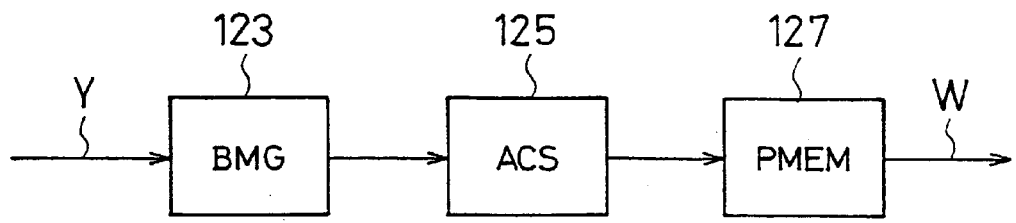
FIG. 19 is a block diagram illustrating a schematic structure of a viterbi decoder in the prior art.
Figure 20:
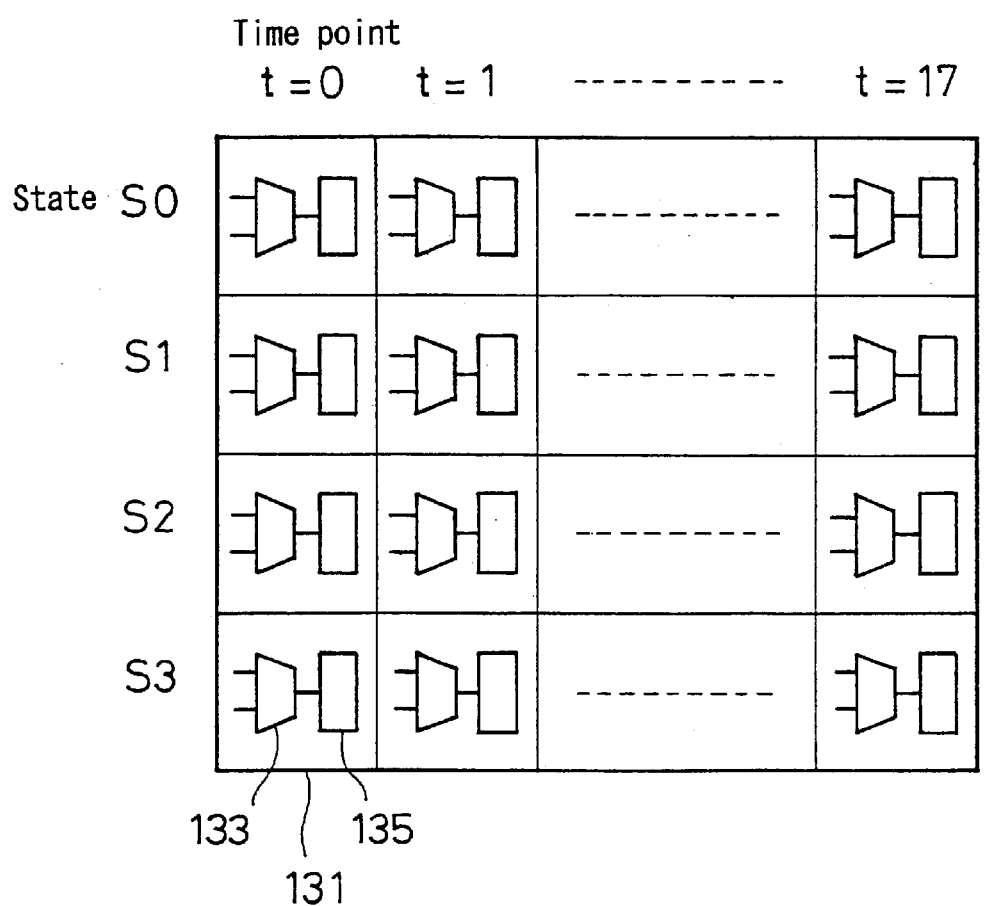
FIG. 20 illustrates a schematic structure of the PMEM provided in the viterbi decoder shown in FIG. 19.

Now, an explanation is given on the operation of the ACS 303 structured as described above to determine the metrics for the state S0–S3 at, for instance, the time point t=1, in reference to FIGS. 9, 10 and 18. It is to be noted that in an initial state, the metric for the state S0 and the metric for the state S1 at the time point t=0 are stored at an address 0 and the metric for the state S2 and the metric for the state S3 at the time point t=0 are stored at an address 1 in the memory MEM1. In addition, the memory MEM1 is set in a data read mode, whereas the memory MEM2 is set in a data write mode. The selection circuit 307 is set so that it will select the data from the memory MEM1 to provide them to the ACS circuit 305.

First, in order to determine the metric for the state S0 at the time point t=1, the address 0 is provided for the memory MEM1 which then outputs the metric for the state S0 and the metric for the state S1 at the time point t=0. Then, the metric for the state S0 is input to the adder 311, and the metric for the state S1 is input to the adder 313. The BMG 123 supplies the metric for the branch extending from the state S0 at the time point t=0 to the state S0 at the time point t=1 to the adder 311, and supplies the metric for the branch extending from the state S1 at the time point t=0 to the state S0 at the time point t=1 to the adder 313. The adder 311, in turn, adds the metric for the state S0 at the time point t=0 and the metric for the branch extending from the state S0 at the time point t=0 to the state S0 at the time point t=1 and outputs the results to the comparator 315 and the selector 317. In addition, the adder 313 adds the metric for the state S1 at the time point t=0 and the metric for the branch extending from the state S1 at the time point t=0 to the state S0 at the time point t=1 and outputs the results to the comparator 315 and the selector 317.

The comparator 315 compares the degrees of likelihood of the output data from the adder 311 and the output data from the adder 313, and outputs the results of the comparison to the selector 317 as a selection signal.

This enables the selector 317 to select either the output data from the adder 311 or the output data from the adder 313 as the metric for the state S0 at the time point t=1. Then, the metric for the state S0 at the time point t=1 is temporarily stored in the latch circuit 309.

Next, the address at the memory MEM1 is updated by 1 in order to obtain the metric for the state S1 at the time point t=1. With this, the metric for the state S2 and the metric for the state S3 at the time point t=0 are output from the memory MEM1 and are respectively input to the adder 311 and the adder 313. The BMG 123 supplies the metric for the branch extending from the state S2 at the time point t=0 to the state S1 at the time point t=1 to the adder 311, and supplies the metric for the branch extending from the state S3 at the time point t=0 to the state S1 at the time point t=1 to the adder 313. The adder 311, in turn, adds the metric for the state S2 at the time point t=0 and the metric for the branch extending from the state S2 at the time point t=0 to the state S1 at the time point t=1 and outputs the results to the comparator 315 and the selector 317. In addition, the adder 313 adds the metric for the state S3 at the time point t=0 and the metric for the branch extending from the state S3 at the time point t=0 to the state S1 at the time point t=1 and outputs the results to the comparator 315 and the selector 317.

The comparator 315 compares the degrees of likelihood of the output data from the adder 311 and the output data from the adder 313, and outputs the results of the comparison to the selector 317 as a selection signal.

This enables the selector 317 to select either the output data from the adder 311 or the output data from the adder 313 as the metric for the state S1 at the time point t=1.

Then, the metric for the state S1 at the time point t=1 output by the selector 317 is written at the address 0 in the memory MEM2 together with the metric for the state S0 at the time point t=1 that has been stored in the latch circuit 309.

Next, in order to determine the metric for the state S2 at the time point t=1, the address 0 is again provided for the memory MEM1 which then outputs the metric for the state S0 and the metric for the state S1 at the time point t=0. Then, the metric for the state S0 is input to the adder 311, and the metric for the state S1 is input to the adder 313. The BMG 123 supplies the metric for the branch extending from the state S0 at the time point t=0 to the state S2 at the time point t=1 to the adder 311, and supplies the metric for the branch extending from the state S1 at the time point t=0 to the state S2 at the time point t=1 to the adder 313. The adder 311, in turn, adds the metric for the state S0 at the time point t=0 and the metric for the branch extending from the state S0 at the time point t=0 to the state S2 at the time point t=1 and outputs the results to the comparator 315 and the selector 317. In addition, the adder 313 adds the metric for the state S1 at the time point t=0 and the metric for the branch extending from the state S1 at the time point t=0 to the state S2 at the time point t=1 and outputs the results to the comparator 315 and the selector 317.

The comparator 315 compares the degrees of likelihood of the output data from the adder 311 and the output data from the adder 313, and outputs the results of the comparison to the selector 317 as a selection signal.

This enables the selector 317 to select either the output data from the adder 311 or the output data from the adder 313 as the metric for the state S2 at the time point t=1. Then, the metric for the state S2 at the time point t=1 is temporarily stored in the latch circuit 309.

Next, the address at the memory MEM1 is updated by 1 in order to obtain the metric for the state S3 at the time point t=1. With this, the metric for the state S2 and the metric for the state S3 at the time point t=0 are output from the memory MEM1 and are respectively input to the adder 311 and the adder 313. The BMG 123 supplies the metric for the branch extending from the state S2 at the time point t=0 to the state S3 at the time point t=1 to the adder 311, and supplies the metric for the branch extending from the state S3 at the time point t=0 to the state S3 at the time point t=1 to the adder 313. The adder 311, in turn, adds the metric for the state S2 at the time point t=0 and the metric for the branch extending from the state S2 at the time point t=0 to the state S3 at the time point t=1 and outputs the results to the comparator 315 and the selector 317. In addition, the adder 313 adds the metric for the state S3 at the time point t=0 and the metric for the branch extending from the state S3 at the time point t=0 to the state S3 at the time point t=1 and outputs the results to the comparator 315 and the selector 317.

The comparator 315 compares the degrees of likelihood of the output data from the adder 311 and the output data from the adder 313, and outputs the results of the comparison to the selector 317 as a selection signal. This enables the selector 317 to select either the output data from the adder 311 or the output data from the adder 313 as the metric for the state S3 at the time point t=1.

Then, the metric for the state S3 at the time point t=1 output by the selector 317 is written at the address 1 in the memory MEM2 together with the metric for the state S2 at the time point t=1 that has been stored in the latch circuit 309.

Through the sequence of operations described above, the metrics of the four states S0–S3 at the time point t=1 are obtained.

Next, in order to determine the metrics for the state S0–S3 at the time point t=2, the memory MEM1 is set in the data write mode, the memory MEM2 is set in the data read mode and the selection circuit 307 is set to supply the data from the memory MEM2 to the ACS circuit 305, so that the metric calculation for the individual states S0–S3 is sequentially performed by the ACS circuit 305 in a manner similar to that employed when determining the metrics for the state S0–S3 at the time point t=1 explained earlier. Subsequently, by sequentially switching between the write mode and the read mode for the memory MEM1 and the memory MEM2 each time the time point t shifts, i. e., each time data in the reception sequence Y are input to the viterbi decoder 301 and by setting the selection circuit 307 accordingly, the metrics for all the states S0–S3 at the individual points in time t can be obtained.

As explained above, the ACS 303 of the viterbi decoder 301 in the fourth embodiment is provided with two memories MEM1 and MEM2, and is constituted in such a manner that the calculation is performed by using the metric for the state stored in one of the memories with the results of the calculation stored in the other. Furthermore, the memory MEM1 and the memory MEM2 are sequentially switched between the write mode and the read mode. As a result, the time required for the metric data transfer from the temporary storage memory 213 into the state metric storage memory 211 necessitated in the viterbi decoder 121 in the prior art apart from the time required for the calculation performed by the ACS 125 is eliminated in the ACS 303. In other words, although the viterbi decoder 301 in the fourth embodiment is provided with only one ACS circuit 305 in order to achieve a reduction in the circuit scale of the ACS 303, it achieves high speed calculation processing. Furthermore, while a dual port memory is often employed to constitute the temporary storage memory 213 in order to achieve faster data transfer in the prior art, all the memories in the viterbi decoder 301 in the fourth embodiment may be each constituted of a single port, to make it possible to reduce the chip area when implementing the viterbi decoder 301 in an LSI.

Fifth Embodiment

The following is an explanation of a viterbi decoder 331 in the fifth embodiment. As illustrated in FIG. 8, this viterbi decoder 331 is constituted by replacing the ACS 303 in the viterbi decoder 301 in the fourth embodiment explained earlier with an ACS 333. It is to be noted that the viterbi decoder 331 described in reference to this embodiment performs decoding on words encoded at an encoding rate R=½ and a constraint length K=3.

Figure 11:
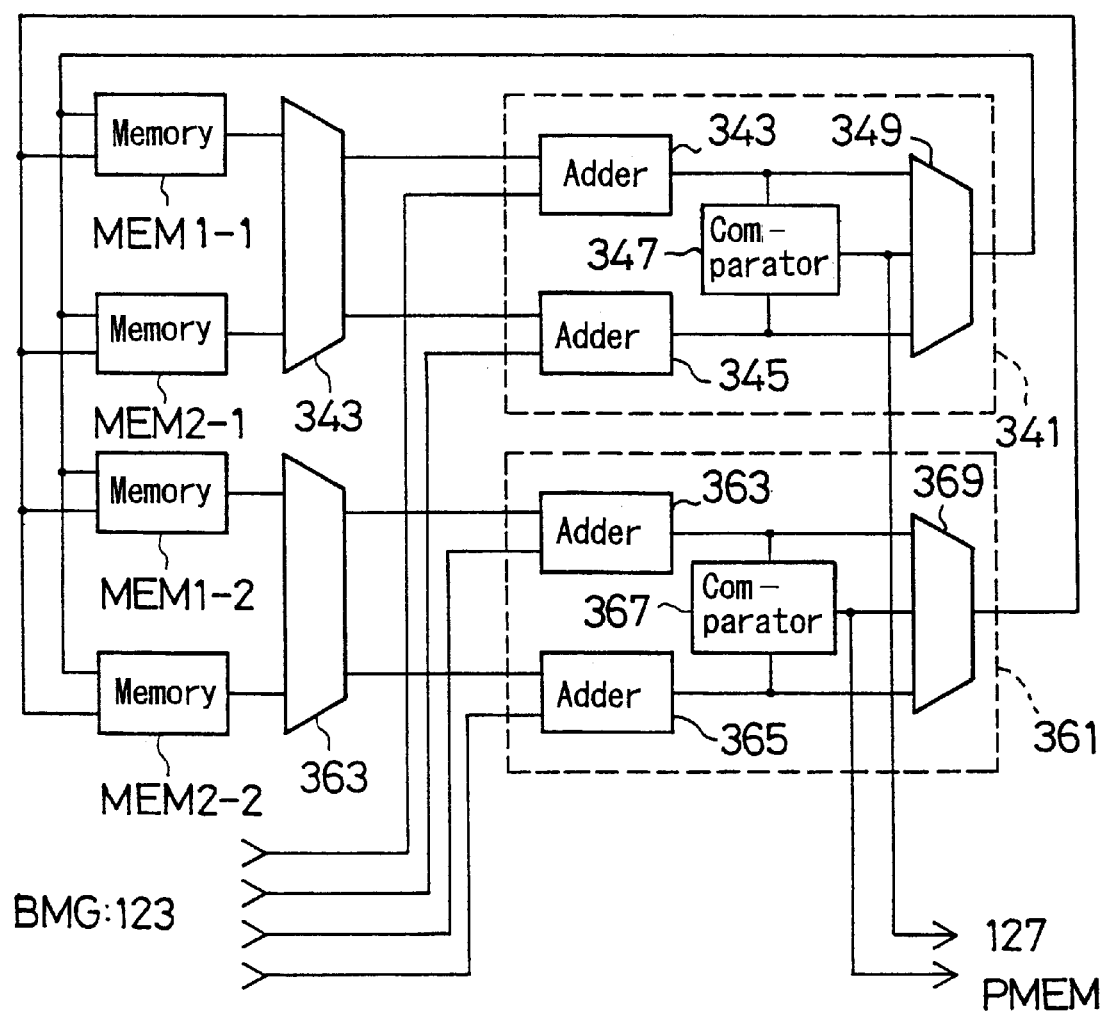
FIG. 11 is a circuit diagram illustrating the internal structure of the ACS provided in the viterbi decoder in the fifth embodiment of the present invention.

As illustrated in FIG. 11, the ACS 333 is constituted so that state metric calculation is performed by two ACS circuits 341 and 361 to achieve a reduction in the circuit scale. In addition, the ACS 333 is provided with four memories, MEM1-1, MEM1-2, MEM2-1 and MEM2-2 for storing state metrics obtained through the calculation performed by the ACS circuits 341 and 361, a selection circuit 343 that selectively supplies data read out from the memory MEM1-1 and the memory MEM2-1 to the ACS circuit 341 and a selection circuit 363 that selectively supplies data read out from the memory MEM1-2 and the memory MEM2-2 to the ACS circuit 361.

The ACS circuit 341 and the ACS circuit 361 are structured almost identically to each other, and also almost identically to the ACS circuit 305 provided in the viterbi decoder 301 in the fourth embodiment. Namely, the ACS circuit 341 is constituted of two adders 343 and 345, a comparator 347 and a selector 349, and the ACS circuit 361 is constituted of two adders 363 and 365, a comparator 367 and a selector 369.

Figure 12:
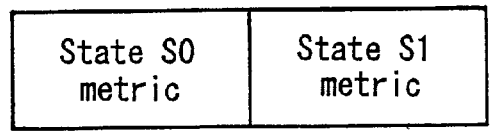
FIG. 12 illustrates a memory map in one of the memories provided in the ACS shown in FIG. 11.
Figure 13:
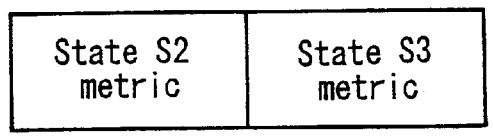
FIG. 13 illustrates a memory map in another memory provided in the ACS shown in FIG. 11.

The four memories MEM1-1, MEM1-2, MEM2-1 and MEM2-2 provided at the ACS 333 have structures that are almost identical to one another. As illustrated in FIG. 12, the memory MEM1-1 and the memory MEM2-1 store the metric for the state S0 and the metric for the state S1. In addition, as illustrated in FIG. 13, the memory MEM1-2 and the memory MEM2-2 store the metric for the state S2 and the metric for the state S3.

Next, details of the connections of the components of the ACS 333 are explained. The adder 343 and the adder 345 in the ACS circuit 341 are structured in such a manner that the branch metric from the BMG 123 and the state metric stored in the memory MEM1-1 are input to the adder 343 and that the branch metric from the BMG 123 and the state metric stored in the memory MEM2-1 are input to the adder 345. The outputs from the adder 343 and the adder 345 are input to the comparator 347 and are also input to the selector 349. The comparator 347 compares the degrees of likelihood of the output data from the adder 343 and the output data from the adder 345 that have been input, and outputs a selection signal to the selector 349 and the PMEM 127. The output of the selector 349 is connected to the four memories MEM1-1, MEM1-2, MEM2-1 and MEM2-2.

The adder 363 and the adder 365 in the ACS circuit 361 are structured in such a manner that the branch metric from the BMG 123 and the state metric stored in the memory MEM1-2 are input to the adder 363 and that the branch metric from the BMG 123 and the state metric stored in the memory MEM2-2 are input to the adder 365. The outputs from the adder 363 from the adder 365 are input to the comparator 367 and are also input to the selector 369. The comparator 367 compares the degrees of likelihood of the output data from the adder 363 and the output data from the adder 365 that have been input, and outputs a selection signal to the selector 369 and the PMEM 127. The output of the selector 369 is connected to the four memories MEM1-1, MEM1-2, MEM2-1 and MEM2-2.

Now, the operations of the ACS 333 structured as described above to determine the metrics for the state S0–S3 at, for instance, the time point t=1, are explained in reference to FIGS. 11, 12, 13 and 18. It is to be noted that in an initial state, the metric for the state S0 and the metric for the state S1 at the time point t=0 are stored in the memory MEM1-1, and the metric for the state S2 and the metric for the state S3 at the time point t=0 are stored in the memory MEM1-2. In addition, the memory MEM1-1 and the memory MEM1-2 are set in the data read mode, whereas the memory MEM2-1 and the memory MEM2-2 are set in the data write mode. The selection circuit 343 is set to select the data from the memory MEM1-1 to supply them to the ACS circuit 341, and the selection circuit 363 is set to select the data from the memory MEM1-2 to supply them to the ACS circuit 361.

First, in order to determine the metric for the state S0 at the time point t=1, the memory MEM1-1 outputs the metric for the state S0 and the metric for the state S1 at the time point t=0. Then, the metric for the state S0 is input to the adder 343, whereas the metric for the state S1 is input to the adder 345.

Concurrently with this, in order to determine the metric for the state S1 at the time point t=1 the memory MEM1-2 outputs the metric for the state S2 and the metric for the state S3 at the time point t=0. Then, the metric for the state S2 is input to the adder 363, whereas the metric for the state S3 is input to the adder 365.

The BMG 123 supplies the metric for the branch extending from the state S0 at the time point t=0 to the state S0 at the time point t=1 to the adder 343, and supplies the metric for the branch extending from the state S1 at the time point t=0 to the state S0 at the time point t=1 to the adder 345.

In addition, the BMG 123 supplies the metric for the branch extending from the state S2 at the time point t=0 to the state S1 at the time point t=1 to the adder 363, and supplies the metric for the branch extending from the state S3 at the time point t=0 to the state S1 at the time point t=1 to the adder 365.

Then, the adder 343 adds the metric for the state S0 at the time point t=0 and the metric for the branch extending from the state S0 at time point t=0 to the state S0 at the time point t=1 and outputs the results to the comparator 347 and the selector 349. In addition, the adder 345 adds the metric for the state S1 at the time point t=0 and the metric for the branch extending from the state S1 at time point t=0 to the state S0 at the time point t=1 and outputs the results to the comparator 347 and the selector 349. The adder 363 adds the metric for the state S2 at the time point t=0 and the metric for the branch extending from the state S2 at time point t=0 to the state S1 at the time point t=1 and outputs the results to the comparator 367 and the selector 369. In addition, the adder 365 adds the metric for the state S3 at the time point t=0 and the metric for the branch extending from the state S3 at time point t=0 to the state S1 at the time point t=1 and outputs the results to the comparator 367 and the selector 369.

The comparator 347 compares the degrees of likelihood of the output data from the adder 343 and the output data from the adder 345 and outputs the results of the comparison to the selector 349 as a selection signal. This enables the selector 349 to select either the output data from the adder 343 or the output data from the adder 345 as the metric for the state S0 at the time point t=1 to be written in the memory MEM2-1. The comparator 367 compares the degrees of likelihood of the output data from the adder 363 and the output data from the adder 365 and outputs the results of the comparison to the selector 369 as a selection signal. This enables the selector 369 to select either the output data from the adder 363 or the output data from the adder 365 as the metric for the state S1 at the time point t=1 to be written in the memory MEM2-1.

Next, in order to determine the metric for the state S2 at the time point t=1, the memory MEM1-1 outputs the metric for the state S0 and the metric for the state S1 at the time point t=0. Then, the metric for the state S0 is input to the adder 343, whereas the metric for the state S1 is input to the adder 345.

Concurrently with this, in order to determine the metric for the state S3 at the time point t=1 the memory MEM1-2 outputs the metric for the state S2 and the metric for the state S3 at the time point t=0. Then, the metric for the state S2 is input to the adder 363, whereas the metric for the state S3 is input to the adder 365.

The BMG 123 supplies the metric for the branch extending from the state S0 at the time point t=0 to the state S2 at the time point t=1 to the adder 343, and supplies the metric for the branch extending from the state S1 at the time point t=0 to the state S2 at the time point t=1 to the adder 345.

In addition, the BMG 123 supplies the metric for the branch extending from the state S2 at the time point t=0 to the state S3 at the time point t=1 to the adder 363, and supplies the metric for the branch extending from the state S3 at the time point t=0 to the state S3 at the time point t=1 to the adder 365.

Then, the adder 343 adds the metric for the state S0 at the time point t=0 and the metric for the branch extending from the state S0 at time point t=0 to the state S2 at the time point t=1 and outputs the results to the comparator 347 and the selector 349. In addition, the adder 345 adds the metric for the state S1 at the time point t=0 and the metric for the branch extending from the state S1 at time point t=0 to the state S2 at the time point t=1 and outputs the results to the comparator 347 and the selector 349. The adder 363 adds the metric for the state S2 at the time point t=0 and the metric for the branch extending from the state S2 at time point t=0 to the state S3 at the time point t=1 and outputs the results to the comparator 367 and the selector 369. In addition, the adder 365 adds the metric for the state S3 at the time point t=0 and the metric for the branch extending from the state S3 at time point t=0 to the state S3 at the time point t=1 and outputs the results to the comparator 367 and the selector 369.

The comparator 347 compares the degrees of likelihood of the output data from the adder 343 and the output data from the adder 345 and outputs the results of the comparison to the selector 349 as a selection signal. This enables the selector 349 to select either the output data from the adder 343 or the output data from the adder 345 as the metric for the state S2 at the time point t=1 to be written in the memory MEM2-2. The comparator 367 compares the degrees of likelihood of the output data from the adder 363 and the output data from the adder 365 and outputs the results of the comparison to the selector 369 as a selection signal. This enables the selector 369 to select either the output data from the adder 363 or the output data from the adder 365 as the metric for the state S3 at the time point t=1 to be written in the memory MEM2-2.

Through the sequence of operations described above, the metrics of the four states S0–S3 at the time point t=1 are obtained.

Next, in order to determine the metrics for the states S0–S3 at the time point t=2, the memory MEM1-1 and the memory MEM2-2 are set in the data read mode and the memory MEM1-1 and the memory MEM1-2 are set in the data write mode. In addition, the selection circuit 343 is set to supply the data from the memory MEM2-1 to the ACS circuit 341 and the selection circuit 363 is set to supply the data from the memory MEM2-2 to the ACS circuit 361. Then, in a manner identical to that employed to determine the metrics for the states S0–S3 at the time point t=1 described above, the metric calculation for the individual state S0–S3 is sequentially performed by the ACS circuit 341 and the ACS circuit 361. After this, by sequentially switching the write mode and the read mode for the memories MEM1-1 and MEM1-2 and the memories MEM2-1 and MEM2-2 and setting the selection circuits 343 and 363 accordingly each time the time point t shifts, i.e., each time the data of the reception sequence Y are input to the viterbi decoder 331, the metrics for all the states S0–S3 at the individual time points t can be obtained.

As explained above, the four memories MEM1-1, MEM1-2, MEM2-1 and MEM2-2 provided at the ACS 333 of the viterbi decoder 331 in the fifth embodiment are switched between the write mode and the read mode at each trellis transition. Thus, the time for metric data transfer from the temporary storage memory 213 to the state metric storage memory 211, which is necessitated in the viterbi decoder 121 in the prior art in addition to the time required for the calculation performed by the ACS 125, is eliminated in the viterbi decoder 331 in the fifth embodiment, as is the case with the viterbi decoder 301 in the fourth embodiment. In other words, the viterbi decoder 301 in the fifth embodiment achieves both a reduction in the circuit scale and a higher speed in the state metric calculation compared to the viterbi decoder 121 in the prior art.

In addition, the ACS 333 in the viterbi decoder 331 in the fifth embodiment is provided with two ACS circuits 341 and 361 so that metric calculation can be performed for two states at the same time. Consequently, the viterbi decoder 331 in the fifth embodiment achieves a higher speed in the state metric calculation compared to the viterbi decoder 301 in the fourth embodiment. It is to be noted that since the ACS 333 does not require the function or structure achieved by the latch circuit 309 provided in the ACS 303 of the viterbi decoder 301 in the fourth embodiment, the extent of the increase in the circuit scale is kept down to the absolute minimum compared to the ACS 125 in the prior art.

Sixth Embodiment

Figure 14:
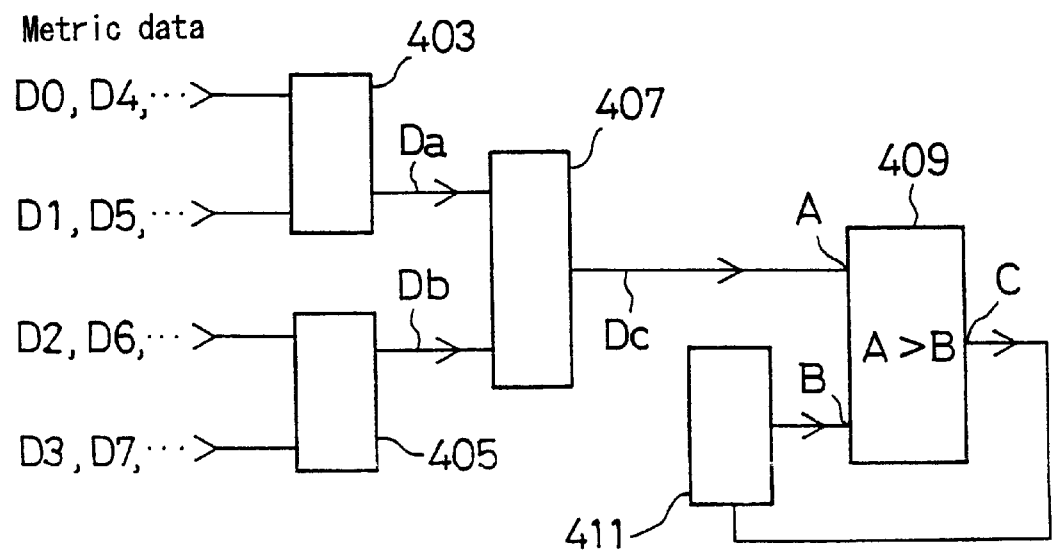
FIG. 14 is a block diagram illustrating the structure of the maximum likelihood state selection circuit employed in the viterbi decoder in a sixth embodiment of the present invention.

Now, a maximum likelihood state selection circuit 401 which may be employed in the viterbi decoders 1, 3, 301 and 331 in the embodiments described earlier is explained. As illustrated in FIG. 14, the maximum likelihood state selection circuit 401 is constituted of four selection circuits 403, 405, 407 and 409 and a holding circuit 411.

Figure 15:
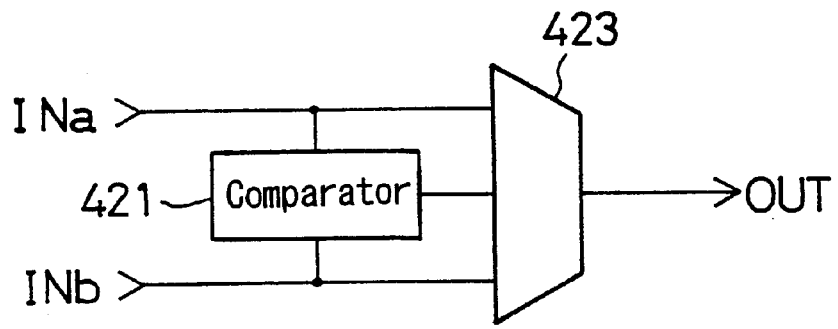
FIG. 15 is a circuit diagram illustrating the internal structure of the selection circuit provided in the maximum likelihood state selection circuit shown in FIG. 14.

The selection circuits 403, 405, and 407 have structures that are almost identical to one another, and are each provided with a comparator 421 and a selector 423 as illustrated in FIG. 15. The comparator 421 compares the degrees of likelihood of data INa and data INb that are input, and provides the results of the comparison to the selection circuit 423 as a selection signal. The selector 423, in turn, selects either the data INa or the data INb with a higher degree of likelihood in conformance to the selection signal provided by the comparator 421, and outputs them as an output signal OUT.

Figure 16:
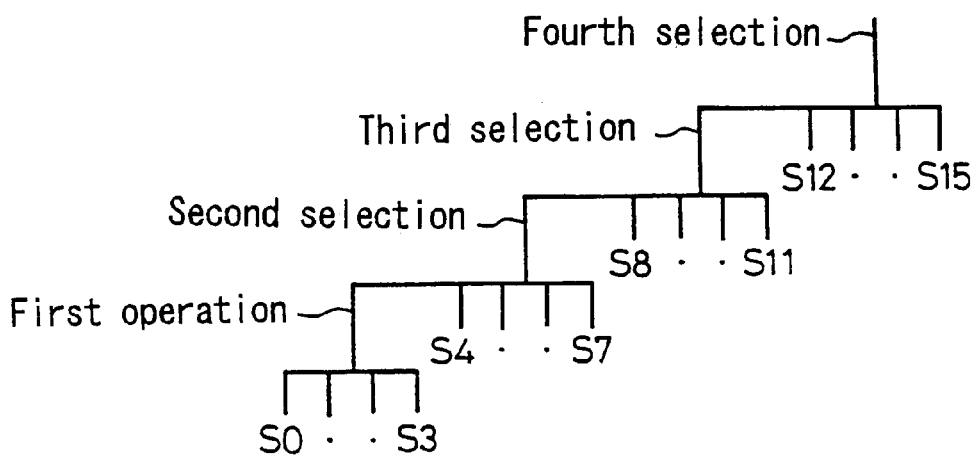
FIG. 16 illustrates the maximum likelihood state selection operation performed at the maximum likelihood state selection circuit shown in FIG. 14.

The following is an explanation of the operation of the maximum likelihood state selection circuit 401 to select the maximum likelihood state among a plurality of states S0–Sn in reference to FIG. 16.

In order to perform the first maximum likelihood state selection, metric data D0 corresponding to the state S0 and metric data D1 corresponding to the state S1 are input to the selection circuit 403 where the data with the higher degree of likelihood are selected. The data Da thus selected are provided to the selection circuit 407. In addition, metric data D2 corresponding to the state S2 and metric data D3 corresponding to the state S3 are input to the selection circuit 405 where the data with the higher degree of likelihood are selected. The data Dc thus selected are provided to the selection circuit 407. In the selection circuit 407, the degrees of likelihood of the data Da and the data Db are compared and the data with the higher degree of likelihood are selected and output as data Dc. Next, the data Dc are supplied to the selection circuit 409.

While the internal structure of the selection circuit 409 is basically similar to that of the other selection circuits 403, 405 and 407 illustrated in FIG. 15, the selection circuit 409 is provided with a function for comparing the degrees of likelihood of the data input through its two input terminals A and B and outputting the data input through the input terminal A from the output terminal C only when the degree of likelihood of the data input through the input terminal A is higher than the degree of likelihood of the data input through the input terminal B.

Now, since the holding circuit 411 is initialized at the start of the first maximum likelihood state selection operation performed by the maximum likelihood state selection circuit 401, the data Dc selected among the metric data D0–D3 are compared by the selection circuit 409 against the initial data with a low degree of likelihood output from the holding circuit 411. As a result, the data Dc are stored at the holding circuit 411 via the selection circuit 409.

Next, when new sets of metric data D4–D7 corresponding to four states S4–S7 are input to the maximum likelihood state selection circuit 401 in order to perform the second maximum likelihood state selection, the degrees of likelihood of the sets of data D4–D7 are compared and a new set of maximum likelihood data Dc is selected. At the selection circuit 409, the degree of likelihood of the set of data Dc is compared against the degree of likelihood of the metric data corresponding to the maximum likelihood state selected through the first maximum likelihood state selection operation written in the holding circuit 411. At this point, if the degree of likelihood of the metric data that are written in the holding circuit 411 is higher, the data Dc are not written in the holding circuit 411. If, on the other hand, the degree of likelihood of the data Dc is higher, the data Dc are written in the holding circuit 411 and held as the metric data corresponding to the maximum likelihood state throughout the first and second maximum likelihood state selection operations. Thus, as a result of the second maximum likelihood state selection operation, the maximum likelihood state among eight states S0–S7 is selected, and as illustrated in FIG. 16, by repeating the maximum likelihood state selection operation four times, the maximum likelihood state among sixteen states S0–S15 is selected.

As explained above, with the maximum likelihood state selection circuit 401, it is possible to select the maximum likelihood state among the sixteen states S0–S15 through four maximum likelihood state selection operations. Such an advantage of the maximum likelihood state selection circuit 401 becomes even more pronounced when the constraint length K is set at 9 and the number of states is 256, and the maximum likelihood state can be selected through 64 selection operations compared to 85 selection operations required in the prior art. In addition, by connecting the input portion of the maximum likelihood state selection circuit 401 to the output portions of the ACS circuits 341 and 361 in the viterbi decoder 331 in the fifth embodiment, for instance, the selection operation for the maximum likelihood state progresses in parallel with the state metric calculation performed by the ACS 333 so that, ultimately, the selection operation of the maximum likelihood state performed by the maximum likelihood state selection circuit 401 is finished by the time the calculation by ACS 333 is completed. In other words, the viterbi decoder provided with the maximum likelihood state selection circuit 401 achieves an efficient decoding operation while keeping down the extent of increase in the circuit scale without having to secure the processing time for selecting the maximum likelihood state separately.

While the invention has been particularly shown and described with respect to preferred embodiments thereof by referring to the attached drawings, the present invention is not limited to these examples and it will be understood by those skilled in the art that various changes in form and detail may be made therein without departing from the spirit, scope and teaching of the invention.

For instance, while the explanation has been given on the viterbi decoders 1, 3, 301 and 331 for the convolutional encoder 101 operating at an encoding rate R=½ and a constraint length K=3 in reference to the embodiments of the present invention, the present invention is not restricted to these examples. By changing as appropriate the memory capacity of the memory unit 13 and the first memory unit 61 and the second memory unit 63 and by adjusting the number of selection circuits SC and the number of selection units SD, similar functions are easily achieved in the viterbi decoders 1 and 3 in the first and second embodiments at varying encoding rates R and varying constraint lengths K. Varying encoding rates R and varying constraint lengths K can be supported in the viterbi decoders 301 and 331 in the fourth and fifth embodiments by changing the memory areas of the memories MEM1 and MEM2, and the memory areas of the memories MEM1-1 and MEM1-2, MEM2-1 and MEM2-2. Furthermore, changes in the number of stages of truncation T can be supported in the viterbi decoders 1 and 3 in the first and second embodiments by changing as appropriate the number of words at the memory unit 13 and at the first memory unit 61 and the second memory unit 63.

In addition, while the ACS 303 in the viterbi decoder 301 in the fourth embodiment is provided with the latch circuit 309 for temporarily storing the metric obtained through the calculation performed by the ACS circuit 305, this latch circuit 309 can be omitted by modifying the memory areas of the memories MEM1 and MEM2 in the following manner. Namely, the memory areas of the memory MEM1 and the memory MEM2 are each divided into two areas to store the state metric at even-numbered time points t=0, 2, 4, . . . in each first memory area and to store the state metrics at odd-numbered time points t=1, 3, 5 . . . in each second memory area. This structure makes it possible to store the results of each operation of state metric calculation directly in the memory MEM1 or the memory MEM2, thereby eliminating the necessity for the latch circuit 309 for temporarily storing the data.

Furthermore, the PMEM 11 and the PMEM 41 described in reference to the first, second and third embodiments and the ACS 303 and the ACS 333 described in reference to the fourth and fifth embodiments may be employed in combination. In addition, the maximum likelihood state selection circuit 401 described in reference to the sixth embodiment may be employed together with them.

As has been explained, with the viterbi decoder according to the present invention, an increase in the number of truncation stages and an increase in the constraint length for the purpose of improving the error correction capability can be supported while keeping down the extent of the increase in the circuit scale to the absolute minimum necessary. Moreover, energy saving is achieved in the trace-back processing as a result of the reduction in circuit scale. In addition, the length of time required for the trace-back processing can be further reduced.

Furthermore, a higher speed is achieved in state metric calculation and, as a result, decoding with a high degree of error correction capability is achieved.

Moreover, the maximum likelihood state can be obtained through a smaller number of operations while keeping down the increase in the circuit scale for implementing comparison and selection of state metrics to the absolute minimum.

The entire disclosure of Japanese Patent Application No.9-163414 filed on Jun. 4, 1997 and Japanese Patent Application No.10-98468 filed on Mar. 25, 1998 including specifications, claims, drawings and summaries are incorporated herein by reference in its entirety.

What is claimed is:

1. A viterbi decoder comprising:
   a branch metric calculation unit that calculates a likelihood of a branch obtained through a received convolutional code;
   a path selection unit that adds metrics of branches extending from a time point t=n to a time point t=n+1 (said time point t=n+1 indicates a point in time one clock cycle after said time point t=n) obtained at said branch metric calculation unit to path metrics of a plurality of states that a convolutional code may assume at said time point t=n (said time point t=n indicates an arbitrary point in time) and compares path metrics for each state at said time point t=n+1 to select an optimal path for each state at said time point t=n+1; and
   a path memory unit that stores in memory path data corresponding to said optimal path for each state at individual points in time, wherein said path memory unit is provided with a memory unit that stores path data corresponding to optimal paths at individual points in time and a selection circuit group that is capable of selecting one state at said time point t=m−1 (said time point t=m−1 indicates a point in time one clock cycle before a point in time t=m) that corresponds to a specific state at said time point t=m (said time point t=m indicates an arbitrary point in time) in conformance to said path data stored in said memory unit.

2. A viterbi decoder according to claim 1, wherein said memory unit is provided with data input/output ports, the number of which corresponds to the total number of states.

3. A viterbi decoder according to claim 1, wherein said memory unit is provided with an address length corresponding to the number of truncation stages of said convolutional code.

4. A viterbi decoder according to claim 1, wherein said path selection unit is provided with
   a first memory for storing metric data corresponding to individual states at a time point t=2n (said time point t=2n indicates an arbitrary point in time occurring every two clocks) and
   a second memory for storing metric data corresponding to said individual states at time point t=2n+1 (said time point t=2n+1 indicates a point in time one clock cycle after said time point t=2n).

5. A viterbi decoder according to claim 4, wherein said path selection unit is provided with one or a plurality of path selection circuits that repeat an operation in which calculation is performed on said metric data stored in said first memory and said branch metric to store calculation results thereof in said second memory and an operation in which calculation is performed on said metric data stored in said second memory and said branch metrics to store calculation results thereof in said first memory at each time point.

6. A viterbi decoder according to claim 5, wherein said first memory and said second memory are each provided with a plurality of memory areas, that correspond to individual path selection circuits.

7. A viterbi decoder according to claim 1, provided with a maximum likelihood state selection circuit that comprises:
   a first likelihood comparison/selection circuit that selects one state metric with a high degree of likelihood among a plurality of state metrics;
   a second likelihood comparison/selection circuit that compares said likelihood of said one state metric and a degree of likelihood of another state metric to select a state metric with a higher degree of likelihood; and
   a holding circuit that holds said state metric selected at said second likelihood comparison/selection circuit and outputs said state metric as another state metric with specific timing.

8. A viterbi decoder according to claim 1, wherein
   said selection circuit group is constituted of a plurality of selection circuits corresponding to said individual states; and
   one of said plurality of selection circuits is selected in conformance to said path data stored in said memory unit.

9. A viterbi decoder according to claim 8, wherein an input portion of individual selection circuits and output portions of individual selection circuits are connected through a circuit configuration that corresponds to branches formed between a plurality of states at said time point t=1 (said time point t=1 indicates an arbitrary point in time) and a plurality of states at said time point t=1+1 (said time point t=1+1 indicates a point in time one clock cycle before said time point t=1).

10. A viterbi decoder according to claim 9, wherein output portions of two specific selection circuits selected from said plurality of selection circuits are connected to an input portion of a specific corresponding selection circuit via an OR gate.

11. A viterbi decoder according to claim 8, wherein said one selection circuit among said plurality of selection circuits constituting said selection circuit group is selected by an external signal at a specific point in time.

12. A viterbi decoder according to claim 8, wherein said selection circuits are each constituted of a logic gate.

13. A viterbi decoder according to claim 8, wherein said selection circuits are each constituted of a path transistor.

14. A viterbi decoder comprising:
   a branch metric calculation unit that calculates a likelihood of a branch obtained through a received convolutional code;
   a path selection unit that adds metrics of branches extending from a time point t=n to a time point t=n+1 (said time point t=n+1 indicates a point in time one clock cycle after said time point t=n) obtained at said branch metric calculation unit to path metrics of a plurality of states that a convolutional code may assume at said time point t=n (said time, point t=n indicates an arbitrary point in time) and compares path metrics for each state at said time point t=n+1 to select an optimal path for each state at said time point t=n+1; and a path memory unit that stores in memory path data corresponding to said optimal path for each state at individual points in time, wherein said path memory unit is provided with N (N represents an arbitrary natural number) memory units for storing path data corresponding to said optimal path at each time point; and N selection circuit groups corresponding to said N memory units each of which is capable of selecting one state at a time point t=m−1 (said time point t=m−1 indicates a point in time one clock cycle before a time point t=m) based upon a specific state at second time point t=m (said time point t=m indicates an arbitrary point in time) in conformance with said path data stored in said memory units.

15. A viterbi decoder according to claim 14, wherein said N memory units are each provided with data input/output ports, the number of which corresponds to said total number of states.

16. A viterbi decoder according to claim 14, wherein said N memory units are each provided with an address length corresponding to 1/N of the number truncation stages of said convolutional code.

17. A viterbi decoder according to claim 14, wherein said path selection unit is provided with a first memory for storing metric data corresponding to individual states at a time point t=2n (said time point t=2n indicates an arbitrary point in time occurring every two clocks) and a second memory for storing metric data corresponding to said individual states at time point t=2n+1 (said time point t=2n+1 indicates a point in time one clock cycle after said time point t=2n).

18. A viterbi decoder according to claim 17, wherein said path selection unit is provided with one or a plurality of path selection circuits that repeat an operation in which calculation is performed on said metric data stored in said first memory and said branch metric to store calculation results thereof in said second memory and an operation in which calculation is performed on said metric data stored in said second memory and said branch metrics to store calculation results thereof in said first memory at each time point.

19. A viterbi decoder according to claim 18, wherein said first memory and said second memory are each provided with a plurality of memory areas, that correspond to individual path selection circuits.

20. A viterbi decoder according to claim 14, provided with a maximum likelihood state selection circuit, comprising:

a first likelihood comparison/selection circuit that selects one state metric with a high degree of likelihood among a plurality of state metrics;

a second likelihood comparison/selection circuit that compares said likelihood of said one state metric and a degree of likelihood of another state metric to select a state metric with a higher degree of likelihood; and a holding circuit that holds said state metric selected at said second likelihood comparison/selection circuit and outputs said state metric as another state metric with specific timing.

21. A viterbi decoder according to claim 14, wherein said N selection circuit groups are each constituted of a plurality of selection circuits corresponding to said individual states; and one of said plurality of selection circuits in one of said N selection circuit groups selects one of said plurality of selection circuits in another one of said N selection circuit groups in conformance to said path data.

22. A viterbi decoder according to claim 21, wherein input portion of said plurality of selection circuits in one of said N selection circuit groups and output portions of said plurality of selection circuits in another one of said N selection circuit groups are connected through a circuit configuration that corresponds to branches formed between a plurality of states at said time point t=1 (said time point t=1 indicates an arbitrary point in time) and a plurality of states at said time point t=1+1 (said time point t=1+1 indicates a point in time one clock cycle after said time point t=1).

23. A viterbi decoder according to claim 22, wherein output portions of two specific selection circuits selected from said plurality of selection circuits in one of said N selection circuit groups are connected to an input portion of a specific corresponding selection circuit in another one of said N selection circuit groups via an OR gate.

24. A viterbi decoder according to claim 21, wherein said one selection circuit among said plurality of selection circuits in one of said N selection circuit groups is selected by an external signal at a specific point in time.

25. A viterbi decoder according to claim 21, wherein said selection circuits are each constituted of a logic gate.

26. A viterbi decoder according to claim 21, wherein said selection circuits are each constituted of a path transistor.

27. A viterbi decoder comprising:

a branch metric calculation unit that calculates a likelihood of a branch obtained through a received convolutional code;

a path selection unit that adds metrics of branches extending from a time point t=n to a time point t=n+1 (said time point t=n+1 indicates a point in time one clock cycle after said time point t=n) obtained at said branch metric calculation unit to path metrics of a plurality of states that a convolutional code may assume at some time point t=n (said time point t=n indicates an arbitrary point in time) and compares path metrics for each state at said time point t=n+1 to select an optimal path for each state at said time point t=n+1; and a path memory unit that stores in memory path data corresponding to said optimal path for each state at individual points in time, wherein said path selection unit is provided with a first memory for storing metric data corresponding to individual states at a time point t=2n (said time point t=2n indicates an arbitrary point in time occurring every two clocks) and a second memory for storing metric data corresponding to said individual states at time point t=2n+1 (said time point t=2n+1 indicates a point in time one clock cycle after said time point t=2n).

28. A viterbi decoder according to claim 27, wherein said path selection unit is provided with one or a plurality of path selection circuits that repeat an operation in which calculation is performed on said metric data stored in said first memory and said branch metric to store calculation results thereof in said second memory and an operation in which calculation is performed on said metric data stored in said second memory and said branch metrics to store calculation results thereof in said first memory at each time point.

29. A viterbi decoder according to claim 28, wherein said first memory and said second memory are each provided with a plurality of memory areas, that correspond to individual path selection circuits.

30. A viterbi decoder according to claim 27 provided with a maximum likelihood state selection circuit comprising:
- a first likelihood comparison/selection circuit that selects one state metric with a high degree of likelihood among a plurality of state metrics;
- a second likelihood comparison/selection circuit that compares said likelihood of said one state metric and a degree of likelihood of another state metric to select a state metric with a higher degree of likelihood; and
- a holding circuit that holds said state metric selected at said second likelihood comparison/selection circuit and outputs said state metric as another state metric with specific timing.

31. A viterbi decoder provided with a maximum likelihood state selection circuit, wherein the maximum likelihood state selection circuit comprises:
- a first likelihood comparison/selection circuit that selects one state metric with a high degree of likelihood among a plurality of state metrics;
- a second likelihood comparison/selection circuit that compares said likelihood of said one state metric and a degree of likelihood of another state metric to select a state metric with a higher degree of likelihood; and
- a holding circuit that holds said state metric selected at said second likelihood comparison/selection circuit and outputs said state metric as another state metric with specific timing.

* * * * *